United States Patent
Azoulay et al.

(10) Patent No.: US 11,773,211 B2
(45) Date of Patent: Oct. 3, 2023

(54) OPEN-SHELL CONJUGATED POLYMER CONDUCTORS, COMPOSITES, AND COMPOSITIONS

(71) Applicants: Jason D. Azoulay, Hattiesburg, MS (US); Lifeng Huang, Hattiesburg, MS (US); Alexander E. London, Hattiesburg, MS (US); Naresh Eedugurala, Hattiesburg, MS (US)

(72) Inventors: Jason D. Azoulay, Hattiesburg, MS (US); Lifeng Huang, Hattiesburg, MS (US); Alexander E. London, Hattiesburg, MS (US); Naresh Eedugurala, Hattiesburg, MS (US)

(73) Assignee: UNIVERSITY OF SOUTHERN MISSISSIPPI, Hattiesburg, MS (US)

(*) Notice: Subject to any disclaimer, the term of this patent is extended or adjusted under 35 U.S.C. 154(b) by 1185 days.

(21) Appl. No.: 16/404,622

(22) Filed: May 6, 2019

(65) Prior Publication Data
US 2020/0362098 A1    Nov. 19, 2020

Related U.S. Application Data

(60) Provisional application No. 62/667,446, filed on May 5, 2018.

(51) Int. Cl.
*C08G 61/12*    (2006.01)
*C08K 3/04*    (2006.01)
(Continued)

(52) U.S. Cl.
CPC .............. *C08G 61/126* (2013.01); *C08J 5/18* (2013.01); *C08K 3/041* (2017.05); *H01B 1/16* (2013.01);
(Continued)

(58) Field of Classification Search
CPC ...... C08G 2261/3223; C08G 2261/126; C08G 2261/124; C08G 2261/95; C08G 2261/91; C07D 417/14
See application file for complete search history.

(56) References Cited

U.S. PATENT DOCUMENTS 5,510,438 A    4/1996    Ferraris et al.
5,552,236 A    9/1996    Ohtake et al.
(Continued)

FOREIGN PATENT DOCUMENTS

EP    0223336 A1    8/1987
EP    1756193 B1    11/2009
(Continued)

OTHER PUBLICATIONS

Extended European Search Report for corresponding European application No. 19887229.3 dated Jun. 29, 2022 (13 pages).
(Continued)

*Primary Examiner* — Shane Fang
(74) *Attorney, Agent, or Firm* — Mendelsohn Dunleavy, P.C.

(57) ABSTRACT

The invention provides for polymer structures and their preparation and resulting novel functionalities including open-shell character and high intrinsic conductivity with wide-range tenability. Electrical conductivity can be further modulated by introducing or blending with materials, fillers, dopants, and/or additives. The materials or resultant composites of the invention can be processed by various techniques into different forms to realize multiple applications.

21 Claims, 13 Drawing Sheets

(51) Int. Cl.
  *C08J 5/18* (2006.01)
  *H01B 1/16* (2006.01)
  *H01B 1/18* (2006.01)

(52) U.S. Cl.
  CPC ......... *H01B 1/18* (2013.01); *C08G 2261/122* (2013.01); *C08G 2261/148* (2013.01); *C08G 2261/1646* (2013.01); *C08G 2261/18* (2013.01); *C08G 2261/3223* (2013.01); *C08G 2261/3225* (2013.01); *C08G 2261/3241* (2013.01); *C08G 2261/3243* (2013.01); *C08G 2261/3246* (2013.01); *C08G 2261/414* (2013.01); *C08G 2261/514* (2013.01); *C08J 2365/00* (2013.01); *C08K 2201/001* (2013.01); *C08K 2201/011* (2013.01)

(56) References Cited

U.S. PATENT DOCUMENTS

| | | | |
|---|---|---|---|
| 5,629,665 | A | 5/1997 | Kaumann et al. |
| 6,083,557 | A | 7/2000 | Belcher et al. |
| 6,262,306 | B1 | 7/2001 | Leriche et al. |
| 6,835,576 | B2 | 12/2004 | Matsuzaki et al. |
| 6,982,514 | B1 | 1/2006 | Lu et al. |
| 8,283,438 | B2 | 10/2012 | David et al. |
| 8,471,204 | B2 | 6/2013 | Bornfreund |
| 8,507,865 | B2 | 8/2013 | Boberl et al. |
| 8,658,751 | B2 | 2/2014 | Han et al. |
| 8,809,487 | B2 | 8/2014 | Seferos et al. |
| 9,035,016 | B2 | 5/2015 | Seferos et al. |
| 9,127,020 | B2 | 9/2015 | Hildebrandt et al. |
| 9,985,211 | B2 | 5/2018 | Blouin et al. |
| 10,426,801 | B2 | 10/2019 | Aboody et al. |
| 10,914,637 | B2 | 2/2021 | Lin et al. |
| 11,312,819 | B2 * | 4/2022 | Azoulay ............... C08G 83/00 |
| 2003/0062480 | A1 | 4/2003 | Kanzaki |
| 2004/0115437 | A1 | 6/2004 | Dammann et al. |
| 2004/0187917 | A1 | 9/2004 | Pichler |
| 2006/0269664 | A1 | 11/2006 | Gleason et al. |
| 2007/0014939 | A1 | 1/2007 | Gaudiana et al. |
| 2007/0111027 | A1 | 5/2007 | Chen et al. |
| 2007/0138945 | A1 | 6/2007 | Hoshi et al. |
| 2007/0181179 | A1 * | 8/2007 | Brabec ............... H01L 27/302 |
| | | | 136/263 |
| 2010/0181552 | A1 | 7/2010 | So |
| 2011/0006287 | A1 | 1/2011 | You et al. |
| 2011/0028656 | A1 | 2/2011 | Bazan et al. |
| 2011/0049367 | A1 | 3/2011 | Forrest et al. |
| 2011/0132460 | A1 * | 6/2011 | Yang ............... H01L 51/0094 |
| | | | 977/734 |
| 2012/0153274 | A1 | 6/2012 | Sonar et al. |
| 2012/0178893 | A1 | 7/2012 | Martin et al. |
| 2013/0032791 | A1 | 2/2013 | Bazan et al. |
| 2013/0092912 | A1 | 4/2013 | You |
| 2013/0225421 | A1 | 8/2013 | Li et al. |
| 2014/0080717 | A1 | 3/2014 | Li et al. |
| 2014/0080986 | A1 | 3/2014 | Bazan et al. |
| 2015/0056142 | A1 | 2/2015 | Tao et al. |
| 2016/0118444 | A1 | 4/2016 | Liu |
| 2016/0290998 | A1 | 10/2016 | Leif et al. |
| 2017/0069814 | A1 | 3/2017 | Bazan et al. |
| 2017/0324901 | A1 | 11/2017 | Mandelli |
| 2018/0017679 | A1 | 1/2018 | Valouch et al. |
| 2019/0194385 | A1 | 6/2019 | Azoulay et al. |
| 2020/0052216 | A1 | 2/2020 | Mitchell et al. |
| 2020/0095371 | A1 | 3/2020 | Tropp et al. |
| 2021/0088449 | A1 | 3/2021 | Makkad et al. |
| 2021/0293706 | A1 | 9/2021 | Tropp et al. |

FOREIGN PATENT DOCUMENTS

| | | | |
|---|---|---|---|
| EP | 1743388 B1 | 3/2012 | |
| JP | 2011116961 A | 6/2011 | |
| JP | 2013254943 A | 12/2013 | |
| JP | 2016065218 A | 4/2016 | |
| KR | 10-2015-0113631 A | 10/2015 | |
| WO | 99/19883 A1 | 4/1999 | |
| WO | 2007016454 A2 | 2/2007 | |
| WO | WO 2011052725 * | 10/2010 | ........... C08G 61/123 |
| WO | 2011028827 A2 | 3/2011 | |
| WO | 2011028827 A3 | 3/2011 | |
| WO | 2011052725 A1 | 5/2011 | |
| WO | 2011156478 A2 | 12/2011 | |
| WO | 2011156478 A3 | 12/2011 | |
| WO | 2012136675 A3 | 10/2012 | |
| WO | 2012174561 A2 | 12/2012 | |
| WO | 2013124688 A3 | 8/2013 | |
| WO | 2017125456 A1 | 7/2017 | |
| WO | 2017180998 A2 | 10/2017 | |
| WO | 2018009924 A1 | 1/2018 | |
| WO | 2018039347 A2 | 3/2018 | |
| WO | 2018039347 A3 | 3/2018 | |
| WO | 2018085055 A1 | 5/2018 | |
| WO | 2019012514 A1 | 1/2019 | |
| WO | 2022026882 A1 | 2/2022 | |

OTHER PUBLICATIONS

Davis, Andrew R., et al. "Surface Grafting of Vinyl-Functionalized Poly(fluorene)s via Thiol-Ene Click Chemistry." Langmuir 30.15 (2014): 4427-4433.

Davis, Andrew R., et al. "Controlling Optoelectronic Behavior in Poly(fluorene) Networks using Thiol-Ene Thoto-Click Chemistry." Macromolecules 48.6 (2015): 1711-1722.

Hoyle, Charles E., et al. "Thiol-Ene Click Chemistry." Angewandte Chemie International Edition 49.9 (2010): 1540-1573.

Killops, Kato L., et al. "Robust, Efficient, and Orthogonal Synthesis of Dendrimers via Thiol-Ene "Click" Chemistry." Journal of the American Chemical Society 130.15 (2008): 5062-5064.

Non-Final Office Action for U.S. Appl. No. 17/139,707; dated Jun. 27, 2022 (10 pages).

Tanwar, Arvin Sain, et al. ""Receptor free" inner filter effect based universal sensors for nitroexplosive picric acid using two polyfluorene derivatives in the solution and solid states." Analyst 144.2 (2019): 669-676.

Hildner, Richard. "Investigation of the Photophysical Properties of pi-Conjugated Polymers: A Study by Non-Linear, Time-Resolved, and Single-Molecule Spectroscopy." Dissertation, University of Bayreuth (2008): 1-147.

Kumar, Jatin N., et al. "Challenges and opportunities of polymer design with machine learning and high throughput experimentation." MRS Communications 9.2 (2019): 537 544.

International Search Report and Written Opinion for corresponding International application No. PCT/US19/30950; dated Mar. 19, 2020 (20 pages).

Guarino, Vincenzo, et al. "Electro-Active Polymers (EAPs): A Promising Route to Design Bio-Organic/Bioinspired Platforms with on Demand Functionalities." Polymers 8.5 Article 185 (2016): 1-26.

Jonas, Friedrich, et al. "Conductive modifications of polymers with polypyrroles and polythiophenes." Synthetic Metals 41.3 (1991): 831-836.

Mirabedini, Azadehsadat, et al. "Developments in conducting polymer fibres: from established spinning methods toward advanced applications." RSC Advances 6.50 (2016): 44687-44716.

Roncali, J. "Molecular Engineering of the Band Gap of π-Conjugated Systems: Facing Technological Applications." Macromolecular Rapid Communications 28.17 (2007): 1761-1775.

Hai, Jiefeng, et al. "Synthesis and photovoltaic performance of novel thiophenyl-methylene-9H-fluorene-based low bandgap polymers." Polymer 54.18 (2013): 4930-4939.

Liu, Jun, et al. "Highly crystalline and low bandgap donor polymers for efficient polymer solar cells." Advanced Materials 24.4 (2012): 538-542.

London, Alexander E., et al. "Donor-acceptor polymers with tunable infrared photoresponse." Polymer Chemistry 8.19 (2017): 2922-2930.

(56) References Cited

OTHER PUBLICATIONS

Wu, Zhenghui, et al. "Temperature-Dependent Detectivity of Near-Infrared Organic Bulk Heterojunction Photodiodes." ACS Applied Materials & Interfaces 9.2 (2017): 1654-1660.
Taylor, D. M., et al. "Memory effect in the current-voltage characteristic of alow-band gap conjugated polymer", Journal of Applied Physics, American Institute of Physics, 90.1 (2001): 306-309.
Cheng, Yen-Ju, et al. "Synthesis of conjugated polymers for organic solar cell applications." Chemical Reviews 109.11 (2009): 5868-5923.
Lee, Kwang-hoi, et al. "Synthesis and photovoltaic behaviors of narrow-band-gap π-conjugated polymers composed of dialkoxybenzodithiophene-and thiophene-based fused aromatic rings." Journal of Polymer Science Part A: Polymer Chemistry 49.6 (2011): 1427-1433.
Wu, Zhenghui, et al. "Elucidating the detectivity limits in shortwave infrared organic photodiodes." Advanced Functional Materials 28.18 (2018): 1800391-1800400.
Willot, Pieter, et al. "The Use of Cyclopenta[2,1-b;3,4-b']dithiophene Analogues for the Development of Low-Bandgap Materials." Macromolecular Chemistry and Physics 213.12 (2012): 1216-1224.
Gautier, Christelle, et al. "A poly (cyclopentadithiophene) matrix suitable for electrochemically controlled DNA delivery." Analytical Chemistry 79.20 (2007): 7920-7923.
Kostianovskii, Vladislav A., et al. "Synthesis of novel conjugated polymers comprising modified cyclopentadithiophene units in the main chain." High Performance Polymers 29.6 (2017): 670-676.
Kim, Hyonwoong, et al. "Solution-processed phototransistors combining organic absorber and charge transporting oxide for visible to infrared light detection." ACS Applied Materials & Interfaces 11.40 (2019): 36880-36885.
Benincori, T., et al.: "Steric Control of Conductivity in Highly Conjugated Polythiophenes . . . " Chemistry Of Materials 13.5(2001): 1665-1673.
Loganathan, Kavithaa, et al. "Δ4, 4'-Dicyclopenta [2, 1-b: 3,4-b'] dithiophene. A Conjugated Bridging Unit for Low Band Gap Conducting Polymers." Chemistry of Materials 15.9 (2003): 1918-1923.
Berlin, Anna, et al. "New low-gap polymers from 3,4-ethylenedioxythiophene-bis-substituted electron-poor thiophenes. The roles of thiophene, donor-acceptor alternation, and copolymerization in intrinsic conductivity." Chemistry of Materials 16.19 (2004): 3667-3676.
Bünnagel, Torsten W., et al. "A Novel Poly [2, 6-(4-dialkylmethylenecyclopentadithiophene)] with "in-Plane" Alkyl Substituents." Macromolecules 25.39 (2006): 8870-8872.
Pao, Yu-Chieh, et al. "Synthesis and molecular properties of tricyclic biselenophene-based derivatives with nitrogen, silicon, germanium, vinylidene, and ethylene bridges." Organic Letters 16.21 (2014): 5724-5727.
Sabuj, Md. Abdus, et al. "Benzobisthiadiazole-based high-spin donor-acceptor conjugated polymers with localized spin distribution." Materials Advances 2.9 (2021): 2943-2955.
Hou, Jianhui, et al. "Bandgap and molecular energy level control of conjugated polymer photovoltaic materials based on benzo [1, 2-b: 4, 5-b'] dithiophene." Macromolecules 41.16 (2008): 6012-6018.

Extended European Search Report for corresponding European application No. 19869325.1; dated Feb. 16, 2022 (21 pages).
Lowe, Andrew B. "Thiol-ene "click" reactions and recent applications in polymer and materials synthesis: a first update." Polymer Chemistry 5.17 (2014): 4820-4870.
Feldman, Kathleen E., et al. "Functional Conducting Polymers via Thiol-ene Chemistry." Biosensors 2.3 (2012): 305-317.
Ibrahimova, Vüsala, et al. "Optical and Electronic Properties of Fluorene-Based Copolymers and Their Sensory Applications." Journal of Polymer Science Part A: Polymer Chemistry 51.4 (2013): 815-823.
Wei, Bin, et al. "Post-polymerization functionalization of poly(3,4-propylenedioxythiophene) (PProDOT) via thiol-ene click chemistry.", Journal of Materials Chemistry B 3.25 (2015): 5028-5034.
International Search Report and Written Opinion for International application No. PCT/UST2019/052489; dated Jul. 23, 2020 (11 pages).
International Search Report and Written Opinion for International application No. PCT/US21/43986; dated Dec. 27, 2021 (11 pages).
Abdellah, Alaa, et al. "Transfer printed P3HT/PCBM photoactive layers: From material intermixing to device characteristics." ACS Applied Materials & Interfaces 8.4 (2016): 2644-2651.
London, Alex E., et al. "A high-spin ground-state donor-acceptor conjugated polymer." Science Advances 5.5 Article eaav2336 (2019): 1-9.
Vella, Jarrett H., et al. "Broadband infrared photodetection using a narrow bandgap conjugated polymer." Science Advances 7.24 Article eabg2418 (2021): 1-7.
Adams, Daniel, et al., U.S. Appl. No. 63/253,529, filed Oct. 23, 2021. "Molecular and Macromolecular Materials & Compositions Exhibiting Magnetic Anisotropies & Ferromagnetism." (34 pages).
Azoulay, Jasond D., et al. U.S. Appl. No. 63/197,352, filed Jun. 5, 2021. "Infrared Bolometer Based on with Intrinsically Conductive Open-Shell Conjugated Polymers." PROV (23 pages).
Azoulay, Jason D., et al. "Bridgehead Imine Substituted Cyclopentadithiophene Derivatives: An Effective Strategy for Band Gap Control in Donor-Acceptor Polymers." Macromolecules 46.4 (2013): 1337-1342.
Azoulay, Jason D., et al. "Narrow Band Gap Conjugated Polymers for Emergent Optoelectronic Technologies." Proc. of SPIE, Light Manipulating Organic Materials and Devices II. vol. 9564. (2015): 46-51.
Foster, Michael E., et al. "Solution-Processable Donor-Acceptor Polymers with Modular Electronic Properties and Very Narrow Bandgaps." Macromolecular Rapid Communications 35.17 (2014): 1516-1521.
Grimm, Bruno, et al. "Structural dependence of the optical properties of narrow bandgap semiconductors with orthogonal donor-acceptor geometries." Chemical Science 4.4 (2013): 1807-1819.
Rodovsky, Deanna B., et al. "Quantifying the Relationship between the Maximum Achievable Voltage and Current Levels in Low-Bandgap Polymer Photovoltaics." The Journal of Physical Chemistry C 117.49 (2013): 25955-25960.
Wright, Brendan F., et al. "Driving Force Dependence of Electron Transfer Kinetics and Yield in Low-Band-Gap Polymer Donor-Acceptor Organic Photovoltaic Blends." The Journal of Physical Chemistry C 119.23 (2015): 12829-12837.

* cited by examiner

OPEN-SHELL CONJUGATED POLYMER CONDUCTORS, COMPOSITES, AND COMPOSITIONS

CROSS-REFERENCE TO RELATED APPLICATION

This application claims priority from U.S. Provisional Patent Application Ser. No. 62/667,446 filed May 5, 2018. The entirety of the provisional application is incorporated herein by reference.

STATEMENT OF GOVERNMENT SUPPORT

This invention was made with government support under grant/contract OIA-1632825 awarded by the National Science Foundation and grant/contact FA9550-17-1-0261 awarded by the U.S. Air Force Office of Scientific Research. The government has certain rights in the invention.

FIELD OF THE INVENTION

The present invention generally relates to novel polymer compounds and methods of preparation of modular narrow band gap conjugated compounds with open-shell character and wide-range tunability of the electrical conductivity as well as the resulting products. These products comprise materials, associated composites, methods, and useful electronic devices with novel functionalities.

BACKGROUND OF THE INVENTION

A critical need exists for new conductive coatings with improved properties. Commercially mature organic optoelectronic technologies are anticipated to grow from a total market of $29.28 billion in 2017 to $73.43 billion in 2027. The majority of these market sectors, which have created billion-dollar markets, comprise OLEDs (lighting and displays), conductive inks, and sensors, which are based on some of the earliest work in the field. Stretchable electronics, logic and memory, thin-film batteries, photovoltaics, electrochromics, etc. have enormous growth potential as they begin to emerge from R&D. Many other applications will be realized that can replace existing semiconductors in ubiquitous uses and create completely new technologies, capabilities, and markets. For example, a U.S. market of over $140 million is anticipated for organic photodetection technologies by 2023, while over $1 billion is expected for building integrated organic-based photovoltaics. The photonics industry as a whole will surpass $1 trillion in 2018 and market penetration of organic semiconductors (OSCs), associated technologies, and new developments will comprise a progressively larger fraction as technologies mature. The global microwave absorber or radar absorbing materials (RAMs) market size was valued at $133.5 million in 2017 and technologies have made use of conductive polymers and composites. New materials are critical in this burgeoning market across the textile, microelectronics, telecommunication shielding, and military and defense applications. The benefits of organic electronics are numerous: ease of fabrication, low-cost, on-demand printing, mechanical flexibility, transparency, reliability, production processes which are significantly more resource-friendly and energy-efficient, scalability, seamless complementary metal-oxide-semiconductor (CMOS) and heterogeneous integration, and tolerance toward structural defects and disorder. These attributes, combined with flexibility in materials and device design, open opportunities not available with inorganics and contrast with the extreme levels of order (low entropy), high temperatures, and painstaking growth requirements of conventional semiconductors. Although extremely promising, OSCs have not yet revolutionized consumer electronics.

Conductive polymers (CPs) and their composites are critical in the development of emerging technologies requiring light-weight structures and the integration of multifunctional properties, such as electrostatic dissipation, electrical conductivity, and electromagnetic (EMI) shielding. Conductive materials are also critical to optoelectronic technologies in the form of transparent electrodes such as in organic light emitting diode (OLED) displays and lighting, thin-film photovoltaics, organic photodetectors, in printed electronics, polymer capacitors, thermoelectrics and finding broad utility in other fields (e.g. medicine, biology). The high conductivity is often achieved by doping or mixing the polymer with conductive fillers and/or additives.

Conductive polymers like polyanilines, polypyrroles, and polythiophenes become conductive by removing an electron from their conjugated π-orbitals via doping. The electrical conductivity results from the delocalization of electrons along the polymer backbone. In conventional conductive polymers, semiconducting polymers, such as poly(3-hexylthiophene) (P3HT) or poly(3,4-ethylenedioxythiophene) (PEDOT), often serve as a conductive composite polymer matrix. In these materials, doping is used to modulate the carrier concentration, band gap and to impart electrical conductivity. Poly(3,4-ethylenedioxythiophene) poly(styrenesulfonate) (PEDOT:PSS), commercially available from Heraeus Group, is the most widely-used conducting polymer for transparent electrodes and often serves as the hole conducting layer between the active polymer and indium tin oxide layer in organic light emitting diodes (OLEDs) and organic photovoltaics (OPVs). The conductivity of materials such as PEDOT is highly dependent on the use of harsh oxidative or reductive "dopants" to achieve appropriate electrical performance. Conductivity also varies considerably as a function of oxidation level, chain alignment, interchain interactions, conjugation length, and degree of disorder, making the doping a critical limiting factor in these material systems. The transitory high conductivity achieved through doping severely diminishes the overall environmental and thermodynamic stability. Harsh dopants, such as strong acids, are corrosive to metallic compounds, oxides and other components routinely used in thin-film optoelectronics, and also associated with serious handling and safety concerns. The corrosive nature imposes dramatic limits on processing and applications; therefore, new approaches that circumvent doping are necessary for technological growth and integration within commercial technologies. Although very high conductivity has been achieved, performance has recently stagnated due to the limited structural tunability and versatility.

An alternative strategy to achieve high conductivity is through generating composites by mixing with conductive fillers/additives, such as metal particles or carbon-based materials. When multifunctionality is required in light-weight, high performing coatings, single-walled carbon nanotubes (SWCNTs) are used due to their high electrical conductivity, high strength, and environmental stability. However, a lack of solubility of pristine SWCNTs and difficulties associated with reliable production methods have largely hampered their potential and application. The final conductivity of the polymer composite largely depends on the properties of the polymer matrix, conductive filler loading, and the resultant interactions. The common limitations hampering the high conductivity in the SWCNT-based composite systems include: (1) increasing SWCNT loading which affords higher conductivity but suffers from high cost, poor dispersity, and processibility issues; (2) purification and sorting of SWCNTs: the residual carbonaceous and metallic impurities from SWCNT manufacturing are commonly purified and removed through a strong acid treatment. The inevitable tube sidewall oxidation from the purification process can significantly alter the electronic properties of SWCNTs by introducing defects acting as scattering sites to reduce charge carrier mobility. The hexagonal $sp^2$ carbon atoms spatial arrangement categorizes the SWCNTs into semiconducting SWNTs (s-SWCNTs) and metallic SWNTs (m-SWNTs). Roughly, s-SWCNTs are two-thirds of the as-produced SWCNT mixture. The scattering-free charge transport property of s-SWCNTs makes them highly desirable for electrical, electronic, and optical applications. However, the process of sorting the s-SWCNTs from the mixture is non-trivial, relying on surfactants, single-stranded DNA, ultracentrifugations, density-gradient ultracentrifugation, and polymer wrapping. The sorting and enrichment efficiency is questionable as well as the potential impact of the residual sorting-assisted species on the composite electronic properties. Furthermore, highly purified s-SWCNTs are often cost prohibitive ($899 for 1 mg s-SWCNTs with 99.9% purity from NanoIntegris Inc); and (3) dispersion of SWCNTs: the approaches to disperse SWCNTs share similar drawbacks to SWCNT sorting, as the homogeneous dispersity normally lays the foundation for sufficient sorting. Despite the aforementioned strategies, the physical dispersion approaches, such as high-power sonication and shearing, are also usually adopted to disperse SWCNTs in the polymer matrix and debundle SWCNTs; however, these approaches suffer from several major drawbacks. First, high shear forces can introduce serious defects to the SWCNT. Second, the physical dispersion approaches are always associated with poor scalability and reproducibility. Third, the dispersed SWCNTs suffer from poor stability as rebundling may initiate right after the sonication and shearing steps. Covalent and noncovalent functionalization of SWCNTs is another common strategy to disperse SWCNTs. The noncovalent functionalization of SWCNTs is considered superior to circumvent the bundling problem due to its advantage of retaining their physical properties without introducing defects to the nanotube structure. Besides non-covalent functionalization approaches, significant research efforts have been directed at wrapping SWCNTs with conjugated polymers to achieve effective dispersion in different solvents. However, it is not always the case that the target polymer matrix material happens to be the effective SWCNTs dispersant. Regarding the film casting technology, spin coating is an easy, inexpensive, and effective method to cast uniform thin film with excellent reproducibility. However, the resultant film is always limited to nanometer level thickness with randomly-dispersed SWCNTs.

Hence, progress in conductive composites development necessitates a versatile, multifunctional, intrinsically conductive charge-neutral polymer matrix that simultaneously serves as an effective and stable SWCNTs dispersant to avoid harsh dopants, high loading levels, complicated SWCNT purification/sorting and high-power dispersion techniques. The current tremendous gap between the market requirement and material availability invokes the development of material with novel functionality, such as open-shell character. Narrow bandgaps afforded through extended π-conjugation are intimately related to the coexistence of nearly degenerate states, which can be tuned through synthetic design. As a result, narrow bandgap donor-acceptor CPs are better described by the intermediate and strong correlation regimes and exhibit open-shell (diradical) character (y), which leads to weaker intramolecular electron-electron pairing compared to "conventional" closed-shell materials. Open-shell character (y) is an important metric that provides insight into the ground state electronic configuration of molecular systems. Conceptually, y represents the degree of electron correlation or the effective bond-order. Since y also correlates to specific excited states, physicochemical properties concerned with those states are strongly correlated and distinct charge transport, high intrinsic conductivity as well as novel optical, spin, and magnetic activities emerge. The present invention demonstrates that polymers with open-shell character can play a pivotal role in overcoming the problems associated with conventional technologies by affording high intrinsic conductivity in the absence of dopants and enhanced conductivity at low filler and additive loadings, and can retain versatile processability while maintaining stability in ambient environments.

A need exists for new and improved conductive coatings having improved properties. The present invention provides such polymer structures and methods for their preparation and the resultant functionalities.

SUMMARY OF THE INVENTION

The present invention provides for polymer structures and their preparation and the resulting novel functionalities: open-shell character and high intrinsic conductivity with wide-range tunability. The electrical conductivity can be further modulated by introducing or blending with other materials, fillers, dopants, and/or additives. The materials or resultant composites can be processed through various processing techniques into different forms to realize different applications.

With the foregoing and other objects, features, and advantages of the present invention that will become apparent hereinafter, the nature of the invention may be more clearly understood by reference to the following detailed description of the preferred embodiments of the invention and to the appended claims.

BRIEF DESCRIPTION OF THE DRAWINGS

These drawings accompany the detailed description of the invention and are intended to illustrate further the invention and its advantages. The drawings, which are incorporated in and form a portion of the specification, illustrate certain preferred embodiments of the invention and, together with the entire specification, are meant to explain preferred embodiments of the present invention to those skilled in the art. Relevant FIGURES are shown or described in the Detailed Description of the Invention as follows.

DETAILED DESCRIPTION OF THE INVENTION

Figure 1:
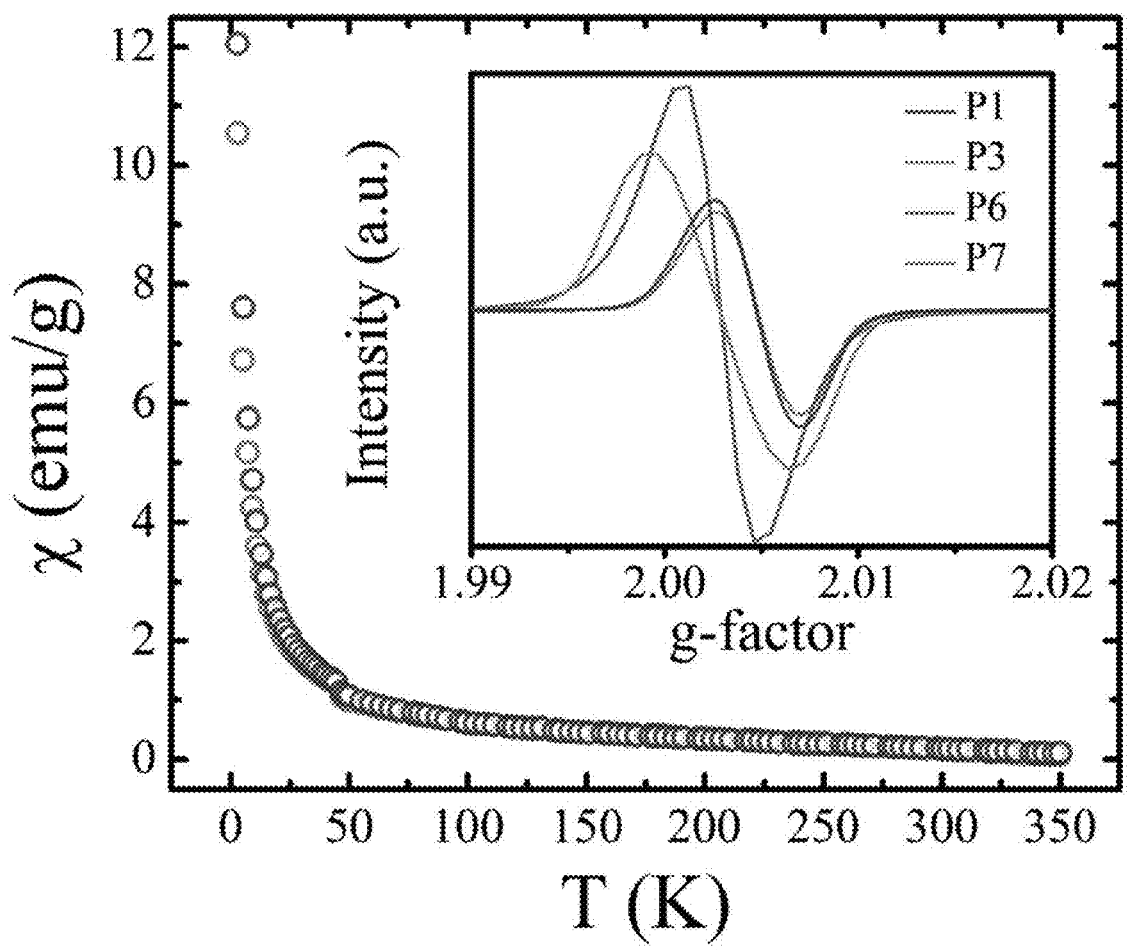
FIG. 1 shows a graphical illustration of the representative superconducting quantum interference device (SQUID) magnetometry and electron paramagnetic resonance (EPR) spectroscopy of P1, P3, P6, and P7 indicating open-shell character is retained in ambient conditions across materials sets in the present invention.

The present invention generally relates to new polymer compounds and methods of preparation of modular narrow band gap conjugated compounds with open-shell character and tunable intrinsic electrical conductivity as well as the resulting products. These products comprise materials, associated composites, methods, and useful electronic devices with novel functionalities.

Organic semiconductors (OSCs) with tunable open-shell ground state (GS) configurations, magnetic properties, strong electron correlation effects (where charge, spin, orbital and structural degrees of freedom result in competing interactions) and improved stability are sought for implementation in emergent thermoelectric, spin-transport, non-linear optical, and memory and logic devices. Maintaining air-stability, solution-processability and controlling open-shell character, however, have been a challenge in small molecule open-shell OSCs, ultimately limiting their utility. The present invention overcomes these major long-standing issues associated with open-shell OSCs through a macromolecular approach that affords: 1) control over the near-degenerate frontier orbital energetics, band gap, interchain spin-spin interactions, solid-state magnetic properties, and other molecular features; and 2) access to open-shell donor-acceptor conjugated copolymers with tunable electronic configurations depending on sterics, torsion, functionality, planarity, and thus ultimately dependence on modular synthetic approaches and structural control. Importantly, the open-shell nature of these materials can result in singlet open-shell ($S_0<T_1$) or triplet open-shell ($S_1>T_0$) ground states where, upon extension of the π-system, further electronic rearrangement can result in polyradicaloid electronic structures. $S_0$, $S_1$, $T_0$, $T_1$ represent the singlet ground state, singlet first excited state, triplet ground state, and triplet first excited state, respectively. The invention also includes methodology for optionally preparing optional end-capped polymer structures for the polymer compound(s).

In general, "open-shell character" in a material is defined as exhibiting: 1) diradical character ($y_0$) or multiple diradical character ($y_{1,2,3...i}$) defined by the occupation numbers of the LUNO (Lowest Unoccupied Natural Orbital)+ (i=0, 1, ...), where $1 \geq y_i \geq 0$, and; 2) X-band room temperature electron paramagnetic resonance (EPR) signal both with or without consideration of hyperfine splitting. Values of $y_i$ and EPR signal intensity are dependent on the band gap, the difference between the singlet and triplet energy levels ($\Delta E_{ST}$) and ultimately dictated by the polymer structure.

In one embodiment, the invention provides polymer structures exhibiting open-shell character consisting of alternating donor-acceptor moieties of the formula:

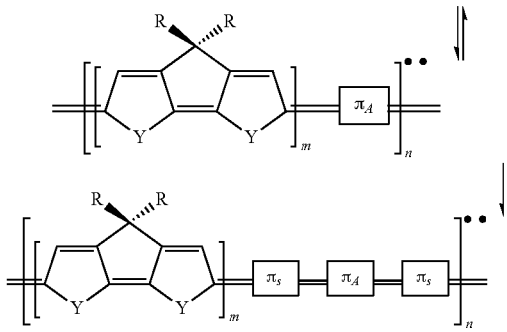

wherein R is selected from the group consisting of unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene $C_6$-$C_{20}$ aryl-$C_0$-$C_{36}$ hydrocarbyl, substituted $C_0$-$C_{36}$ hydrocarbylene $C_6$-$C_{20}$ aryl $C_0$-$C_{36}$ hydrocarbyl, F, Cl, Br, I, CN, $SR_2$—OH, —OR, —COOH, —COOR, —NH$_2$, —NHR$_2$, or NR$_2$R$_3$, where R$_2$ and R$_3$ are independently selected from a $C_1$-$C_{24}$ hydrocarbyl group;

$\pi_A$ is a moiety that is electron deficient, highly planar, pro-quinoidal, induces a transition from an aromatic electronic state to the quinoidal state, narrows the band gap, lowers $\Delta E_{ST}$, and enhances the multiple diradical character $y_i$ thus promoting open-shell character and the tenability of $y_i$ can be achieved through the introduction of $\pi_S$, which refers to any conjugated spacer;

Y is selected from the group consisting of, S, Se, Te, Si, BR$_3$, PR$_3$, NH, NR, NR$_2$ or Si, wherein R of this group comprises suitable functionalities; m is either 1 or 2, n is an integer >1, and the resulting polymer exhibits a singlet open-shell electronic ground state defined by the $S_0$ electronic state lying below $T_1$.

In another embodiment, the invention provides polymer structures exhibiting open-shell character consisting of alternating donor-acceptor moieties of the formula:

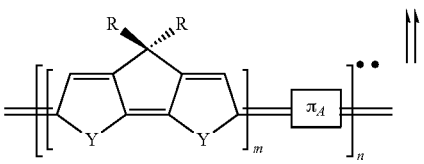

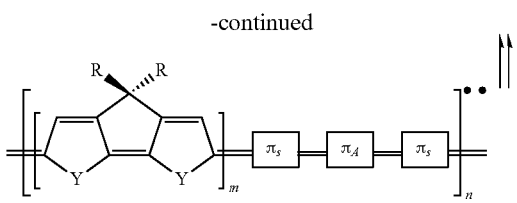

wherein R is selected from the group consisting of unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene $C_6$-$C_{20}$ aryl-$C_0$-$C_{36}$ hydrocarbyl, substituted $C_0$-$C_{36}$ hydrocarbylene $C_6$-$C_{20}$ aryl $C_0$-$C_{36}$ hydrocarbyl, F, Cl, Br, I. CN, $SR_2$—OH, —OR, —COOH, —COOR, —$NH_2$, —$NHR_2$, or $NR_2R_3$, where $R_2$ and $R_3$ are independently selected from a $C_1$-$C_{24}$ hydrocarbyl group;

$\pi_A$ is a moiety that is electron deficient, highly planar, pro-quinoidal, induces a transition from an aromatic electronic state to the quinoidal state, narrows the band gap, lowers $\Delta E_{ST}$, and enhances the multiple diradical character $y_i$ thus promoting open-shell character and the tunability of $y_i$ can be achieved through the introduction of $\pi_S$, which refers to any conjugated spacer;

Y is selected from the group consisting of, S, Se, Te, Si, $BR_3$, $PR_3$, NH, NR, $NR_2$ or Si, wherein R of this group comprises suitable functionalities; m is 1 or 2, n is an integer >1, and the resulting polymer exhibits a triplet open-shell electronic ground state defined by the $T_0$ electronic state lying below $S_1$. The number and spatial extent of the triplet states is dictated by the value of n which can at sufficient values result in high-spin open-shell polyradicaloids.

In an additional embodiment, the invention provides polymer structures exhibiting open-shell character consisting of alternating donor-acceptor moieties of the formula:

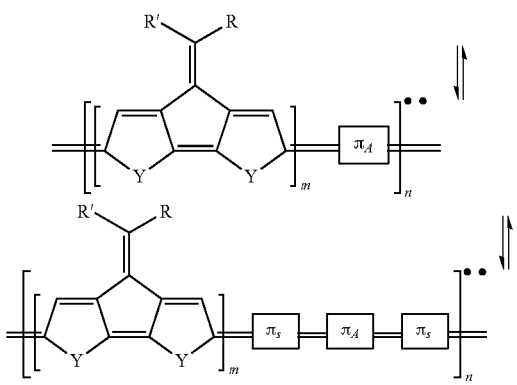

wherein R and R' are selected from the group consisting of unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene $C_6$-$C_{20}$ aryl-$C_0$-$C_{36}$ hydrocarbyl, substituted $C_0$-$C_{36}$ hydrocarbylene $C_6$-$C_{20}$ aryl $C_0$-$C_{36}$ hydrocarbyl, F, Cl, Br, I, CN, —R2, $SR_2$—OH, —$OR_2$, —COOH, —$COOR_2$, —$NH_2$, —$NHR_2$, or $NR_2R_3$, where $R_2$ and $R_3$ are independently selected from a $C_1$-$C_{24}$ hydrocarbyl group;

$\pi_A$ is a moiety that is electron deficient, highly planar, pro-quinoidal, induces a transition from an aromatic electronic state to the quinoidal state, narrows the band gap, lowers $\Delta E_{ST}$, and enhances the multiple diradical character $y_i$ thus promoting open-shell character and the tunability of $y_i$ can be achieved through the introduction of $\pi_S$, which refers to any conjugated spacer;

Y is selected from the group consisting of, S, Se, Te, Si, $BR_3$, $PR_3$, NH, NR, $NR_2$ or Si, wherein R of this group comprises suitable functionalities; m is either 1 or 2, n is an integer >1, and the resulting polymer exhibits a singlet open-shell electronic ground state defined by the $S_0$ electronic state lying below $T_1$. The number and spatial extent of the singlet states is dictated by the value of n and can at sufficient values result in polyradicaloids.

In yet another embodiment, the invention provides polymer structures exhibiting open-shell character consisting of alternating donor-acceptor moieties of the formula:

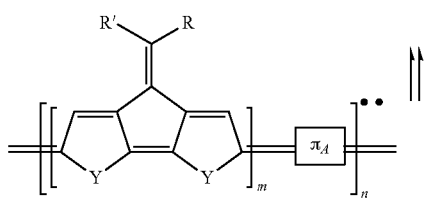

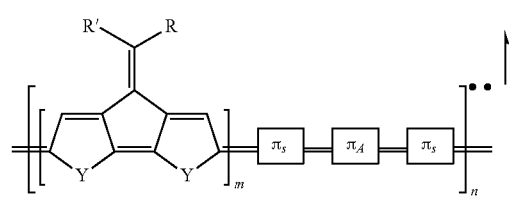

wherein R and R' are selected from the group consisting of unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene $C_6$-$C_{20}$ aryl-$C_0$-$C_{36}$ hydrocarbyl, substituted $C_0$-$C_{36}$ hydrocarbylene $C_6$-$C_{20}$ aryl $C_0$-$C_{36}$ hydrocarbyl, F, Cl, Br, I, CN, —R2, $SR_2$—OH, —$OR_2$, —COOH, —$COOR_2$, —$NH_2$, —$NHR_2$, or $NR_2R_3$, where $R_2$ and $R_3$ are independently selected from a $C_1$-$C_{24}$ hydrocarbyl group;

$\pi_A$ is a moiety that is electron deficient, highly planar, pro-quinoidal, induces a transition from an aromatic electronic state to the quinoidal state, narrows the band gap, lowers $\Delta E_{ST}$, and enhances the multiple diradical character $y_i$ promoting open-shell character while stabilizing the triplet state relative to the singlet; $\pi_S$ is any conjugated spacer;

Y is selected from the group consisting of, S, Se, Te, Si, $BR_3$, $PR_3$, NH, NR, $NR_2$ or Si, wherein R of this group comprises suitable functionalities; m is 1 or 2, n is an integer >1, and the resulting polymer exhibits a triplet open-shell electronic ground state defined by the $T_0$ electronic state lying below $S_1$. The number and spatial extent of the triplet states are dictated by the value of n, and can at sufficient values result in high-spin open-shell polyradicaloids.

In reference to the previous four novel polymer structures recited herein, $\pi_A$ is selected from substituted and unsubstituted moieties selected from the group consisting of thiadiazoloquinoxaline, quinoxaline, thienothiadiazole, thienopyridine, thienopyrazine, pyrazinoquinoxaline, benzothiadiazole, bis-benzothiadiazole, benzobisthiadiazole, thiazole, thiadiazolothienopyrazine, diketopyrrolopyrrole, or a combination thereof, and is a moiety that is electron deficient, highly planar, pro-quinoidal, induces a transition from an aromatic electronic state to the quinoidal state, narrows the band gap, lowers $\Delta E_{ST}$, and enhances $y_i$ thus promoting open-shell character.

In a separate embodiment, the invention provides polymer structures exhibiting open-shell character consisting of alternating donor-acceptor moieties of the formula:

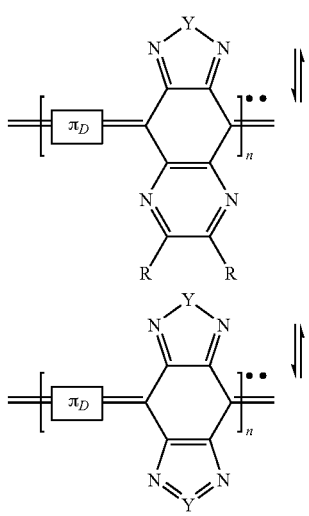

wherein R is selected from the group consisting of unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene $C_6$-$C_{20}$ aryl-$C_0$-$C_{36}$ hydrocarbyl, substituted $C_0$-$C_{36}$ hydrocarbylene $C_6$-$C_{20}$ aryl $C_0$-$C_{36}$ hydrocarbyl, F, Cl, Br, I, CN, —R2, SR$_2$—OH, —OR$_2$, —COOH, —COOR$_2$, —NH$_2$, —NHR$_2$, or NR$_2$R$_3$, where R$_2$ and R$_3$ are independently selected from a $C_1$-$C_{24}$ hydrocarbyl group;

Y is selected from the group consisting of, S, Se, Te, Si, BR$_3$, PR$_3$, NH, NR, NR$_2$ or Si, wherein R of this group is selected from the group consisting of unsubstituted $C_1$-$C_{36}$ hydrocarbyl, substituted $C_1$-$C_{36}$ hydrocarbyl, or any combination thereof;

n is an integer >1, and the resulting polymer exhibits a singlet open-shell electronic ground state defined by the $S_0$ electronic state lying below $T_1$; and $\pi_D$ is a moiety that is electron rich, highly planar, pro-quinoidal, induces a transition from an aromatic electronic state to the quinoidal state, narrows the band gap, lowers $\Delta E_{ST}$, and enhances the multiple diradical character $y_i$ promoting open-shell character. The number and spatial extent of the singlet states are dictated by the value of n, and at sufficient values can result in open-shell singlet polyradicaloids.

In another embodiment, the invention provides polymer structures exhibiting open-shell character consisting of alternating donor-acceptor moieties of the formula:

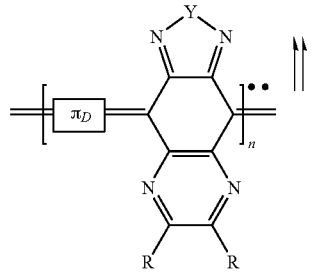

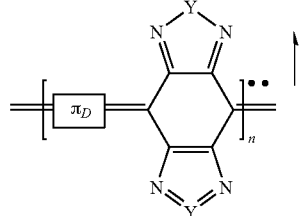

wherein R is selected from the group consisting of unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene $C_6$-$C_{20}$ aryl-$C_0$-$C_{36}$ hydrocarbyl, substituted $C_0$-$C_{36}$ hydrocarbylene $C_6$-$C_{20}$ aryl $C_0$-$C_{36}$ hydrocarbyl, F, Cl, Br, I, CN, —R2, SR$_2$—OH, —OR$_2$, —COOH, —COOR$_2$, —NH$_2$, —NHR$_2$, or NR$_2$R$_3$, where R$_2$ and R$_3$ are independently selected from a $C_1$-$C_{24}$ hydrocarbyl group;

Y is selected from the group consisting of, S, Se, Te, Si, BR$_3$, PR$_3$, NH, NR, NR$_2$ or Si, wherein R of this group is selected from the group consisting of unsubstituted $C_1$-$C_{36}$ hydrocarbyl, substituted $C_1$-$C_{36}$ hydrocarbyl, or any combination thereof;

n is an integer >1, and the resulting polymer exhibits a triplet open-shell electronic ground state defined by the $T_0$ electronic state lying below $S_1$; and $\pi_D$ is a moiety that is electron rich, highly planar, pro-quinoidal, induces a transition from an aromatic electronic state to the quinoidal state, narrows the band gap, lowers $\Delta E_{ST}$, and enhances the multiple diradical character $y_i$ promoting open-shell character. The number and spatial extent of the triplet states is dictated by the value of n, and at sufficient values can result in high-spin open-shell polyradicaloids.

In a separate embodiment, the invention provides polymer structures exhibiting open-shell character consisting of alternating donor-acceptor moieties of the formula:

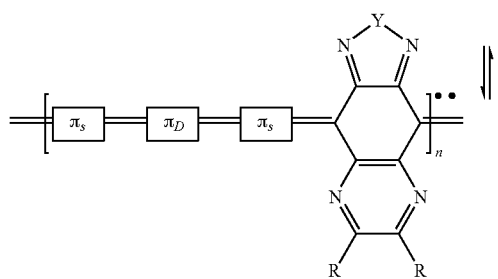

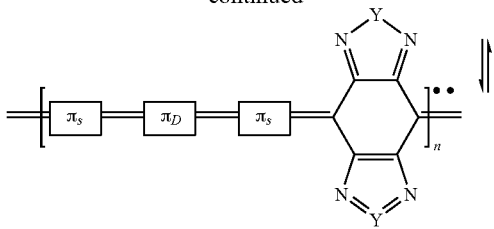

wherein R is selected from the group consisting of unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene $C_6$-$C_{20}$ aryl-$C_0$-$C_{36}$ hydrocarbyl, substituted $C_0$-$C_{36}$ hydrocarbylene $C_6$-$C_{20}$ aryl $C_0$-$C_{36}$ hydrocarbyl, F, Cl, Br, I, CN, —R2, $SR_2$—OH, —$OR_2$, —COOH, —$COOR_2$, —$NH_2$, —$NHR_2$, or $NR_2R_3$, where $R_2$ and $R_3$ are independently selected from a $C_1$-$C_{24}$ hydrocarbyl group;

$\pi_D$ is a moiety that is electron rich, highly planar, pro-quinoidal, induces a transition from an aromatic electronic state to the quinoidal state, narrows the band gap, lowers $\Delta E_{ST}$, and enhances the multiple diradical character $y_i$ promoting open-shell character and the tunability of $y_i$ can be achieved through the introduction of $\pi_S$, which refers to any conjugated spacer;

Y is selected from the group consisting of, S, Se, Te, Si, $BR_3$, $PR_3$, NH, NR, $NR_2$ or Si, wherein R of this group is selected from the group consisting of unsubstituted $C_1$-$C_{36}$ hydrocarbyl, substituted $C_1$-$C_{36}$ hydrocarbyl, or any combination thereof;

n is an integer >1, and the resulting polymer exhibits a singlet open-shell electronic ground state defined by the $S_0$ electronic state lying below $T_1$. The number and spatial extent of the singlet states are dictated by the value of n, and at sufficient values can result in open-shell singlet polyradicaloids.

In another embodiment, the invention provides polymer structures exhibiting open-shell character consisting of alternating donor-acceptor moieties of the formula:

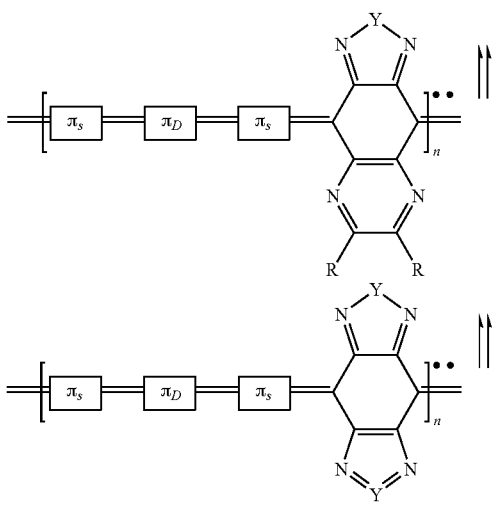

wherein R is selected from the group consisting of unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene, substituted $C_0$-$C_{36}$ hydrocarbylene, F, Cl, Br, I, CN, —$R_2$, $SR_2$—OH, —$OR_2$, —COOH, —$COOR_2$, —$NH_2$, —$NHR_2$, or $NR_2R_3$, where $R_2$ and $R_3$ are independently selected from a $C_1$-$C_{24}$ hydrocarbyl group, wherein substituted derivatives comprise hydrocarbyl, aryl, heteroaryl, or hydrocarbylene substituents functionalized with one (or multiple) R groups;

$\pi_D$ is a moiety that is electron rich, highly planar, pro-quinoidal, induces a transition from an aromatic electronic state to the quinoidal state, narrows the band gap, lowers $\Delta E_{ST}$, and enhances the multiple diradical character $y_i$ promoting open-shell character and the tunability of $y_i$ can be achieved through the introduction of $\pi_S$, which refers to any conjugated spacer;

Y is selected from the group consisting of, S, Se, Te, Si, $BR_3$, $PR_3$, NH, NR, $NR_2$ or Si, wherein R is selected from the group consisting of unsubstituted $C_1$-$C_{36}$ hydrocarbyl, substituted $C_1$-$C_{36}$ hydrocarbyl, or any combination thereof;

n is an integer >1, and the resulting polymer exhibits a triplet open-shell electronic ground state defined by the $T_0$ electronic state lying below $S_1$. The number and spatial extent of the triplet states are dictated by the value of n, and at sufficient values can result in high-spin polyradicaloids.

In reference to the immediately-previous four novel polymer structures recited herein, $\pi_D$ is selected from substituted and unsubstituted moieties from the group consisting of thiophene, bithiophene, dithienothiophene, selenophene, biselenophene, diselenoselenophene, cyclopentadithiophene, cyclopentadiselenophene, or a combination thereof, and is a moiety that is electron rich, highly planar, pro-quinoidal, induces a transition from an aromatic electronic state to the quinoidal state, narrows the band gap, lowers $\Delta E_{ST}$, and enhances $y_i$ thus promoting open-shell character.

A further embodiment consists of the optional end-capped polymer structures for the polymer compound(s):

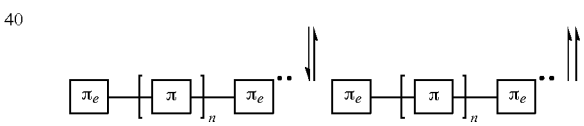

wherein $\pi_n$ is selected from any previous novel polymer compound structure recited herein; and $\pi_e$ is any substituted and unsubstituted moieties selected from the group consisting of thiophene, bithiophene, dithienothiophene, selenophene, biselenophene, diselenoselenophene, cyclopentadithiophene, cyclopentadiselenophene, or a combination thereof, and unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene, substituted $C_0$-$C_{36}$ hydrocarbylene, F, Cl, Br, I, CN, —$R_2$, $SR_2$—OH, —$OR_2$, —COOH, —$COOR_2$, —$NH_2$, —$NHR_2$, or $NR_2R_3$, where $R_2$ and $R_3$ are independently selected from a $C_1$-$C_{24}$ hydrocarbyl group, wherein substituted derivatives comprise hydrocarbyl, aryl, heteroaryl, or hydrocarbylene substituents functionalized with one (or multiple) R groups.

In general, the present invention further establishes structure-property relationships for open-shell intrinsically conductive polymers and their composites or products, overcoming significant obstacles in conductive composite manufacturing. The pristine thin film (without filler or doping) conductivity can be varied over five orders of magnitude (from $10^{-5}$ to 4.6 S cm$^{-1}$) exhibiting strong structure-property dependence and wide range conductivity tunability. This novel innovation demonstrates high-performance and stable composites with low loadings of pristine, well-dispersed SWCNTs through an approach that circumvents doping, SWCNT sorting and purification, and additional SWCNT dispersion through the implementation of intrinsically conductive open-shell ground-state donor-acceptor polymers as non-covalent dispersants. The resultant conductive film can attain a few micrometers thickness, 10 S cm$^{-1}$ order of magnitude conductivity at 15% SWCNTs loading level and the conductivity performance is stable for months to one year after exposing to light, air, and moisture. Pertaining to the invention, "open-shell character" refers to molecules with characteristic electron paramagnetic resonance (EPR) signal, and characteristic magnetization signal in a superconducting quantum interference device (SQUID) magnetometer or any instrument capable of direct magnetization measurement.

In one embodiment, the form of the final conductive product (pristine polymer or composite or the mixture of these two) can be, but is not limited to, suspension or solution, gel, films with various thickness, bulk with various dimensions and shapes.

In another embodiment, the conductive product can be formed during the polymerization process by mixing or blending a filler, dopant, and/or additive with monomers during the polymerization or after polymerization by introducing or blending with filler/dopant/additive with the polymers.

In an additional embodiment, the conductive product can be dissolved in a certain solvent or solvent mixtures simultaneously or in sequence at any concentration. The solvent may include, but is not limited to, organic solvents, such as chlorinated hydrocarbons (e.g., chloroform); aliphatic nitriles (e.g., acetonitrile); aliphatic ketones (e.g., acetone); aliphatic alcohols (e.g., ethanol); aliphatic hydrocarbons (e.g., hexanes); aliphatic sulfoxides (e.g., dimethyl sulfoxide); aromatic hydrocarbons (e.g., xylenes); and/or aliphatic carboxylic esters (e.g., ethyl acetate). The solvent also can be aqueous solvents such as water or a mixture of water with another water-miscible organic solvent, such as tetrahydrofuran, dimethylformamide, and/or lower alcohols, or a combination of organic and aqueous solvent.

In a separate embodiment, the invention demonstrates a fast, easy, straightforward method to prepare uniform and highly conductive product thin films (nanometer scale) via spin coating of conductive product on certain substrates. The achieved pristine film conductivity varies from $10^{-5}$ to 4.6 S cm$^{-1}$ as a function of the polymer structures P1-P7 and a very large conductivity increase was observed across different polymer structures and processing techniques. Thin composite film conductivity on the order of 0.1 S cm$^{-1}$ was achieved for P1 and P2.

In another embodiment, the invention provides a simple preparation process for thick, uniform, surface smooth and highly conductive product development on certain substrates. The conductive product film can be cast on a substrate from 5-15 mg mL$^{-1}$ conductive product solution or suspension by slow evaporation in a closed container with or without a reservoir of certain solvent or solvent mixtures. The slow evaporation process provides high-quality uniform and thicker (few micrometer scale) pristine films with the conductivity varying from $10^{-4}$ to $10^{-3}$ S cm$^{-1}$ based on P1 and P2 and on the order of 10 S cm$^{-1}$ for SWCNT based composite. This method remarkably accelerates the composite preparation process without compromising the conductivity which lays the foundation for potential industrialization.

In yet another embodiment, the invention provides a process to prepare free-standing conductive product films. The films can be delaminated from the substrate to be free-standing which is important for various processes.

In an additional embodiment, the conductive polymer film formation technique with various thickness and dimensions can be extended to conventional or novel solution-based processes, including but not limited to, spin coating, spray coating, brush coating, doctor blade coating, electrospinning, dip coating, meniscus, curtain casting, drop casting, ink jet printing, screen printing, reel to reel printing, roll to roll printing, directional solidification, aligning polymers on rubbed or grooved substrates, or a combination of these processing techniques. The substrates which can support the film process include but are not limited to, solid materials (rigid, semi-flexible, or flexible) including glass, quartz, metal, plastic, silicon, silica, mineral, ceramic, semiconducting material, or a combination thereof. The film post-treatment techniques include, but are not limited to, thermal annealing at different temperatures, solvent annealing with different solvents or solvent mixtures, mechanical rubbing, template wetting, stretching, or a combination of these or different techniques.

In a separate embodiment, the conductive product bulk material formation also can be realized by methods including, but not limited to, friction transfer, melting process, such as compression modeling, extrusion, and/or injecting modeling.

In a separate embodiment, this invention provides a simple, "in situ" process to disperse SWCNTs in certain solvents with the assistance of the CPs acting as the polymer matrix as well as effective SWCNTs dispersants under mild sonication conditions. The π-conjugated backbone from the CPs wraps the nanotube wall by van der Waals and π-interaction with the nanotube π-electron surface to support SWCNTs debundling, while the soluble groups from the polymer, such as alkyl side chains, can permit necessary solubility in organic solvents. Additionally, the modular synthetic approaches of CPs can be adapted to directly tune the polymer-nanotube interactions. By this, the harsh sonication and shearing, covalent functionalization process and additional dispersants can be avoided to secure the SWCNTs structure integrity and system purity. Manipulating the SWCNTs solubility and dispersity coupled with a highly conductive CP matrix can yield highly conductive composite films.

In another embodiment, the conductivity of the conductive product also can be modulated in a wide range by introducing or blending with other conductive, semi-conductive, or non-conductive fillers or additives at any loading and combination including, but not limited to, metal particles such as aluminum, nickel, silver, and copper; any carbon-based materials such as s-SWCNTs, m-SWCNTs, MWCNTs (multi-walled carbon nanotubes), graphene, graphite, fullerenes, and carbon fiber manufactured from different processes with different sizes; non-conductive materials such as clay, dyes, mica, pigments, insulating polymers such as polystyrene, poly(methyl methacrylate), polyvinyl chloride; other conducting polymers such as PEDOT:PSS, polyaniline, or any polymers of the novel polymer compounds and structures of the invention previously recited herein; and semiconducting polymers such as P3HT; or a combination thereof. Other additives may also be added, if necessary, to modify the specific properties of the resultant composite, including modulus, surface tension, weatherability, surface wettability, viscosity, and color, for example.

In an additional embodiment, the intrinsic conductivity of the claimed polymers is high enough (up to 4.6 S cm$^{-1}$) to be comparable with most doped semiconducting polymers. The polymers with unprecedented intrinsic conductivity in the absence of dopants offer significant advantages, which were previously inaccessible by the doped semiconducting materials. However, the conductivity of the conductive product also can be further elevated through structural modification or by introducing or blending with certain dopants or the mixture of these dopants at any loading. The dopants include, but are not limited to, conventional acidic dopants (p-dopants) such as mineral acids (e.g., HCl); organic sulfonic acids (e.g., camphor sulfonic acid); polymeric sulfonic acids (e.g., poly(styrene sulfonic acid)); polycarboxylic acids (e.g., poly(maleic acid); carboxylic acids (e.g., oxalic acid); dopants based on suitable base such as K, Li; open-shell small radical dopants, such as, galvinoxyl radical, TEMPO radical; and/or any other suitable dopants such as F4-TCNQ or $I_2$, or a combination thereof.

In a separate embodiment, the invention provides a method to develop highly conductive products with excellent weathering stability. The conductivity of the resultant conductive product is retained for more than one year after exposure to different environmental conditions, including air, light, and moisture which overcomes a big challenge in the field, particularly for technologies based on doped semiconducting polymer matrices.

The invention includes the application of these novel conductive products in the areas of, for example: display (liquid crystal display, LCD/organic light-emitting diode, OLED), such as antistatic coating of packing trays for displays and related parts and components transportation, display antistatic film to prevent ESD (electro-static discharge) and dust problems when protective films are being peeled off, capacitive-based touch technology and touch sensor electrodes for touch panels within smartphones, tablets, human-machine interfaces (HMIs), and other devices which can be flexible, foldable, curved, 3D-shapeable, and/or wearable, LCD IPS (in-plane switching) shielding layers to protect the display against static charges and ESD, hole-injection layer (HIL) for OLED/QLED (quantum dot display), conductive adhesives in displays, electrodes for wide range of applications such as in solar cells, touch screens, light emitting diodes, and flexible displays, printed electrochromics for display technology, and electrodes for thin film transistor (TFT) backplanes of LCD and OLED displays; lighting, such as electrodes for electroluminescence (EL) lighting and HIL and electrodes for OLEDs; sensors, such as sensor electrodes in various sensors, such as capacitive touch sensors, piezoelectric pressure sensors, organic photodetectors, conformal skin sensors, and bioelectrodes; automotive, such as electrodes and core parts for printed capacitive touch sensors, switches, sliders, rotary wheels, modern space-saving OLED lighting, and curved, 3-dimensional smart surfaces; organic solar cells, such as electrodes and hole transport layer (HTL) for organic solar cells; polymer capacitors, such as anode material for capacitors; antistatic coating, such as antistatic, static dissipative, and conductive coatings to prevent damage of sensitive electronic components by ESD; printed electronics, such as novel polymers and their composites which can be adapted for printed electronics; microwave absorbing, such as electronics; elimination of EMI interference issues and reduction of noise in electronic packages, such as in telecommunication (RF suppression, PIM (passive inter modulation) reduction), healthcare (low loss dielectrics and EMI shielding), textiles (EMI shielding for wearable electronics), military and defense (electronic warfare, radar isolation, antennas and suppression), automotive (eliminating cross talk and RF leakage, and anechoic chambers (fire retardant pyramidal and convoluted absorbers).

EXAMPLES

Example 1. This example involved the exemplary structures of CPs (conjugated polymers): P1, P2, P3, P4, P5, P6, and P7 with different backbones and side chains. Pn represents their general D-A formula.

Scheme 1.
The exemplary structures (P1-P7) for novel open-shell CPs and their general formula Pn

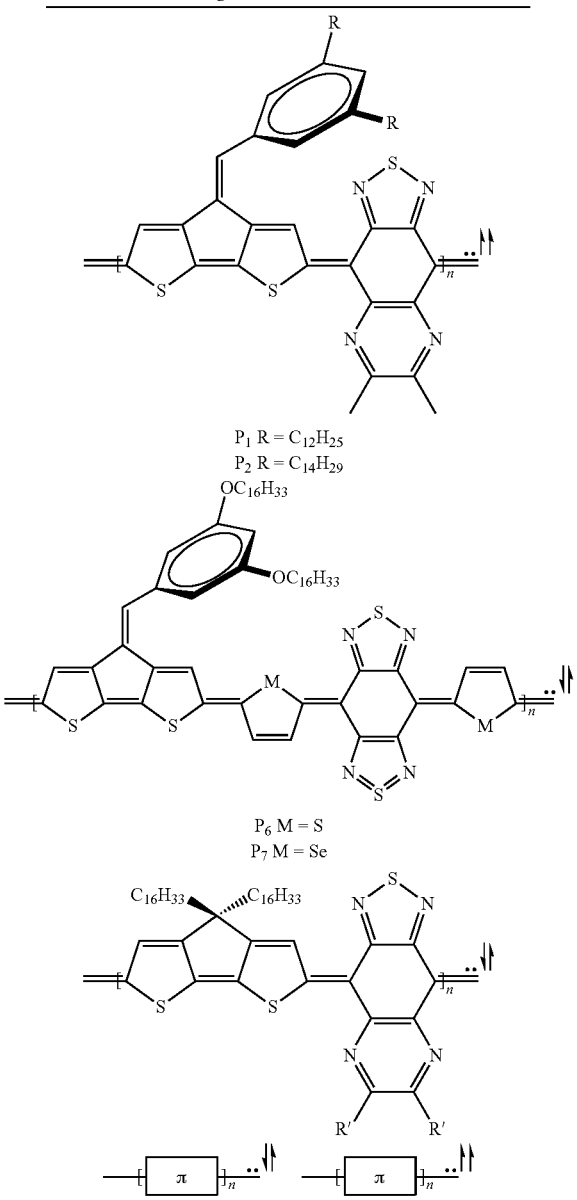

$P_1$ R = $C_{12}H_{25}$
$P_2$ R = $C_{14}H_{29}$ $P_6$ M = S
$P_7$ M = Se

Example 2. This example involved the detailed material synthesis procedure for P1:

P1: A microwave tube was loaded with (4-(3,5-didodecylbenzylidene)-4H-cyclopenta[2,1-b:3,4-b']dithiophene-2,6-diyl)bis(trimethylstannane) (150 mg, 0.162 mmol) and 4,9-dibromo-6,7-dimethyl-[1,2,5]thiadiazolo[3,4-g]quinoxaline (57.8 mg, 0.155 mmol). The tube was brought inside the glovebox, and 750 µL of a Pd(PPh$_3$)$_4$/xylenes stock solution (3.5 mol %) was added. The tube was sealed and subjected to the following reaction conditions in a microwave reactor with stirring: 120° C. for 5 min, 140° C. for 5 min, and 170° C. for 30 min. After this time, the reaction was allowed to cool, leaving a solid gelled material. The mixture was precipitated into methanol and collected via filtration. The residual solid was loaded into an extraction thimble and washed successively (under a N$_2$ atmosphere and in the absence of light) with methanol (2 h), acetone (2 h), hexanes (2 h), a 1:1 mixture of hexanes and tetrahydrofuran (12 h), and then acetone (2 h). The polymer was dried in vacuo to give 85 mg (68%) of a black solid. Data are as follows: $M_n$=15.0 kgmol$^{-1}$ and Đ=1.50; $^1$HNMR (600 MHz, 1,1,2,2-tetrachloroethane-d$_2$, 398 K): δ 8.00 to 6.50 (6H, br m), 3.60 to 2.50 (4H, br m), 2.30 to 1.15 (40H, br m), 1.10 to 0.80 (6H, br m), and 0.72 (6H, s); absorption: $\lambda_{max}$ (solution, 1,2-dichlorobenzene, 25° C.)=1.25 µm, $\lambda_{max}$ (thin film)=1.30 µm, and ε=16,057 L mol$^{-1}$ cm$^{-1}$.

Example 3. This example involved the detailed material synthesis procedure for P2:

P2: A microwave tube was loaded with (4-(3,5-ditetradecylbenzylidene)-4H-cyclopenta[2,1-b:3,4-b']dithiophene-2,6-diyl)bis(trimethylstannane) (88 mg, 0089 mmol) and 4,9-dibromo-6,7-dimethyl-[1,2,5]thiadiazolo[3,4-g]quinoxaline (31.8 mg, 0.085 mmol). The tube was brought inside the glovebox, and 410 µL of a Pd(PPh3)4/xylenes stock solution (3.5 mol %) was added. The tube was sealed and subjected to the following reaction conditions in a microwave reactor with stirring: 120° C. for 5 min, 140° C. for 5 min, and 170° C. for 30 min. After this time, the reaction was allowed to cool, leaving a solid gelled material. The mixture was precipitated into methanol and collected via filtration. The residual solid was loaded into an extraction thimble and washed successively (under a N$_2$ atmosphere and in the absence of light) with methanol (2 h), acetone (2 h), hexanes (2 h), a 1:1 mixture of hexanes and tetrahydrofuran (12 h), and then acetone (2 h). The polymer was dried in vacuo to give 62 mg (77%) of a black solid. Absorption: $\lambda_{max}$ (solution, CHCl$_3$, 25° C.)=1.21 µm, $\lambda_{max}$ (thin film)=1.32 µm.

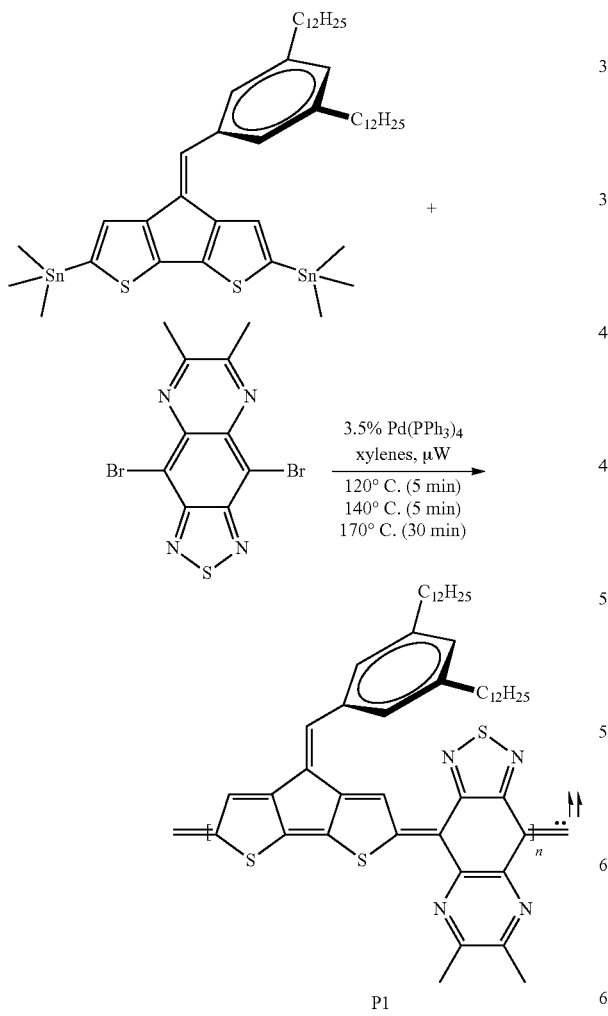

P1

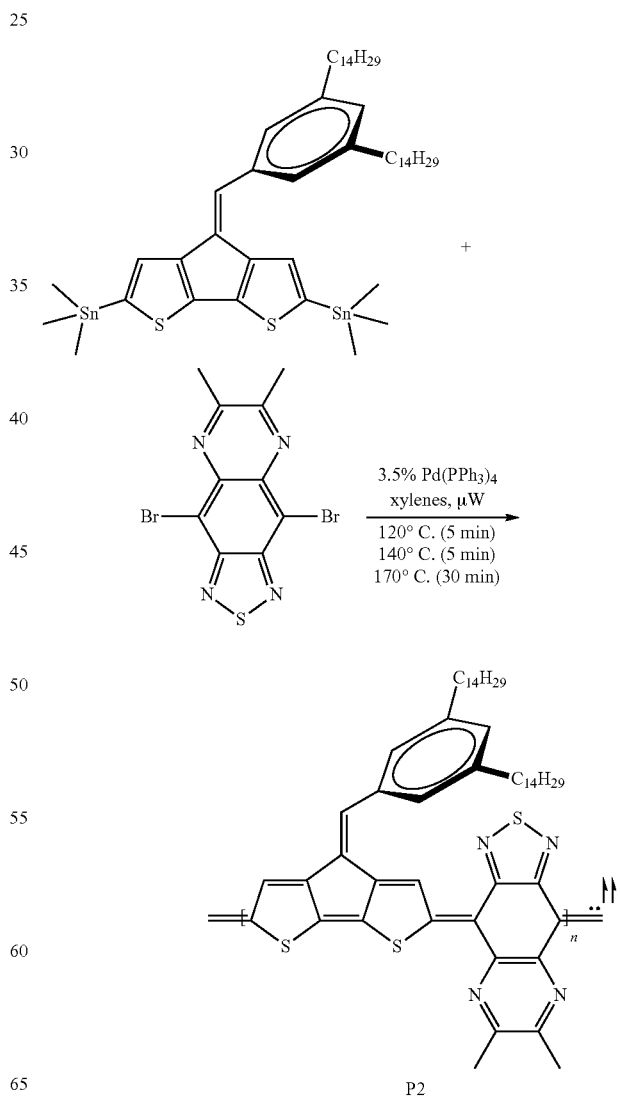

P2

Example 4. This example involved the detailed material synthesis procedure for P3, P4, and P5:

General procedure for the polymer synthesis: (4,4-dialkyl-4H-cyclopenta[2,1-b:3,4-b']dithiophene-2,6-diyl)bis(trimethyl-stannane) (0.107 mmol, 1.05 equiv), 4,9-dibromo-6,7-dialkyl-[1,2,5]thiadiazolo[3,4-g]quinoxaline (0.101 mmol, 1.0 equiv) were weighed into a microwave tube with a stir bar and 3.5 mol % of Pd(PPh$_3$)$_4$ in 250 μL xylene was added inside the glove box. The tube was sealed and subjected to the reaction conditions in a microwave reactor. The reaction mixture was cooled to room temperature, and the polymer was precipitated into methanol. The polymer was then filtered and purified by Soxhlet extraction (under N$_2$ atmosphere and protected from light) using methanol (2 h), acetone (2 h), hexanes (12 h) and followed by acetone (2 h) in the end. The residual solvent under reduced pressure was removed to afford the black solid product.

P3: Conditions: 120° C. for 5 min, 140° C. for 5 min, and 170° C. for 20 min. Yield: 80%. $^1$H NMR (600 MHz, 1,1,2,2-Tetrachloroethane-d$_2$, 398 K): δ 9.41-9.04 (br, 2H), 3.23-2.85 (br, 4H, CDT-CH$_2$), 2.36-2.15 (br, 4H, CH$_2$), 1.44-0.93 (br, 88H, CH$_2$, CH$_3$). Absorption: λ$_{max}$ (solution, CHCl$_3$, ambient temperature)=1.15 μm; λ$_{max}$ (thin film)=1.23 μm; ε=23413 L mol$^{-1}$ cm$^{-1}$. ICP-OES: Pd=0.15 wt % (0.014 mmol g−1) and no Fe and Sn were detected.

P4: Conditions: 120° C. for 5 min, 140° C. for 5 min, 170° C. for 60 min, and 190° C. for 10 min. Yield: 72%. $^1$H NMR (600 MHz, chloroform-d, 333 K): δ 9.38-9.16 (br, 1H), 7.99-7.84 (br, 2H), 7.69-7.24 (br, 4H), 2.26-2.11 (br, 2H, CH$_2$), 1.44-0.80 (br, 64H, CH$_2$, CH$_3$). Absorption: λ$_{max}$ (solution, CHCl$_3$, ambient temperature)=1.38 μm; λ$_{max}$ (thin film)=1.46 μm; ε=33841 L mol$^{-1}$ cm$^{-1}$.

P5: Conditions: 120° C. for 5 min, 140° C. for 5 min, 170° C. for 60 min, and 190° C. for 10 min. Yield: 79%. $^1$H NMR (600 MHz, chloroform-d, 333 K): δ 9.31-8.88 (br, 1H), 7.95-7.40 (br, 3H), 7.24-6.93 (br, 2H), 2.34-1.85 (br, 4H, CH$_2$), 1.44-0.97 (br, 60H), 0.96-0.76 (br, 6H). Absorption: λ$_{max}$ (solution, CHCl$_3$, ambient temperature)=1.46 μm; λ$_{max}$ (thin film)=1.66 μm; ε=33087 L mol$^{-1}$ cm$^{-1}$.

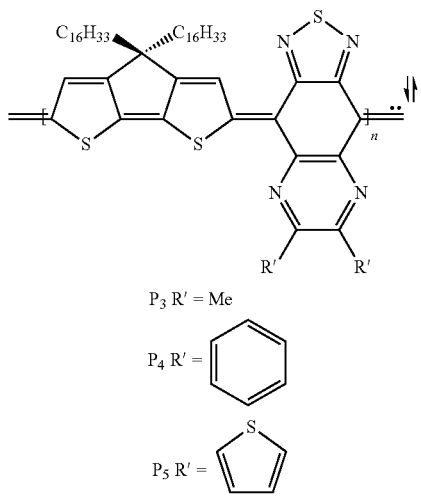

Example 5. This example involved the detailed material synthesis procedure for P6:

P6: 4-(3,5-bis(hexadecyloxy)benzylidene)-4H-cyclopenta[2,1-b:3,4-b']dithiophene-2,6-diyl)bis(trimethylstannane) (100 mg, 0.093 mmol, 1.05 equiv), 4,7-bis(5-bromothiophen-2-yl)-2λ$^4$δ$^2$-benzo[1,2-c;4,5-c']bis[1,2,5]thiadiazole (46 mg, 0.08 mmol, 1.0 equiv) were weighed into a microwave tube with a stir bar and 3.5 mol % of Pd(PPh$_3$)$_4$ in 430 μL xylene was added inside the glove box. The tube was sealed and subjected to the following reaction conditions in a microwave reactor with stirring: 120° C. for 5 min, 140° C. for 5 min, and 170° C. for 5 min. The reaction mixture was cooled to room temperature, and the polymer was precipitated into methanol. The polymer was then filtered and purified by Soxhlet extraction (under N$_2$ atmosphere and protected from light) using methanol (2 h), acetone (2 h), hexanes (2 h), 2:1 mixture of hexanes and THF (12 h) and followed by acetone (2 h) in the end. The polymer was dried in vacuo to afford 83 mg (80%) black solid product. Absorption: λ$_{max}$ (solution, CHCl$_3$, ambient temperature)=1.18 μm; λ$_{max}$ (thin film)=1.29 μm.

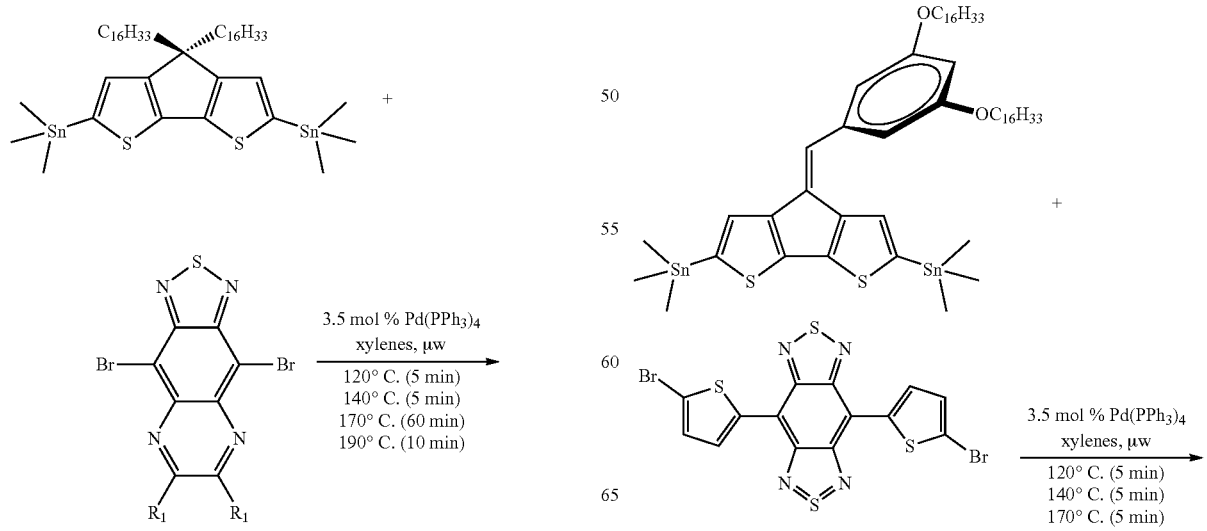

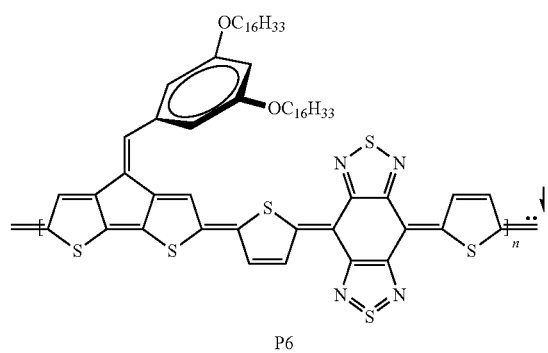

P6

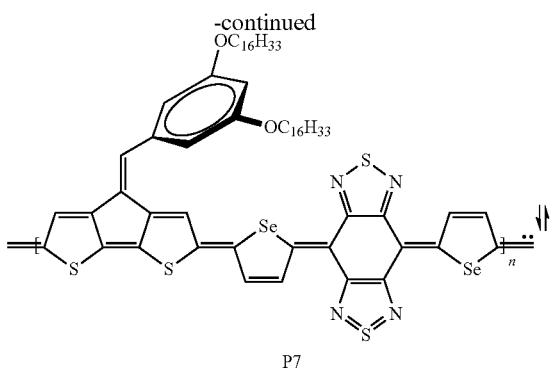

P7

Example 6. This example involved the detailed material synthesis procedure for P7:

P7: 4-(3,5-bis(hexadecyloxy)benzylidene)-4H-cyclopenta[2,1-b:3,4-b']dithiophene-2,6-diyl)bis(trimethylstannane) (80 mg, 0.075 mmol, 1.05 equiv), 4,7-bis(5-bromo selenophen-2-yl)-2$\lambda^4\delta^2$-benzo[1,2-c;4,5-c']bis[1,2,5]thiadiazole (43 mg, 0.071 mmol, 1.0 equiv) were weighed into a microwave tube with a stir bar and 3.5 mol % of Pd(PPh$_3$)$_4$ in 340 μL xylene was added inside the glove box. The tube was sealed and subjected to the following reaction conditions in a microwave reactor with stilling: 120° C. for 5 min, 140° C. for 5 min, and 150° C. for 5 min. The reaction mixture was cooled to room temperature, and the polymer was precipitated into methanol. The polymer was then filtered and purified by Soxhlet extraction (under N$_2$ atmosphere and protected from light) using methanol (2 h), acetone (2 h), hexanes (2 h), 1:1 mixture of hexanes and THF (12 h) and followed by acetone (2 h) in the end. The polymer was dried in vacuo to afford 63 mg (70%) black solid product. Absorption: $\lambda_{max}$ (solution, CHCl$_3$, ambient temperature)=1.40 μm; $\lambda_{max}$ (thin film)=1.49 μm.

Example 7. This example involved the general synthesis procedure for end-capping after the polymerization:

After the polymerization, the microwave tube sealed with polymer was pumped into a N$_2$-filled glove box. 1 mL xylenes, 0.5 mol % of Pd(PPh$_3$)$_4$ in xylenes solution, and 0.25 equivalence of trimethyl(thiophen-2-yl)stannane were added to the tube and following by heating at 100° C. for 8 h. Then another 0.5 mol % of Pd(PPh$_3$)$_4$ in xylene solution and 10 equivalence of 2-bromothiophene were added to the tube and subjected to heating at 100° C. for another 8 h. The reaction mixture was cooled to room temperature, and the polymer was precipitated into methanol. The polymer was then filtered and purified by Soxhlet extraction (under N$_2$ atmosphere and protected from light) using methanol (2 h), acetone (2 h), hexanes (2 h), 1:1 mixture of hexanes and THF (12 h) and followed by acetone (2 h). The polymer was dried in vacuo to afford solid products.

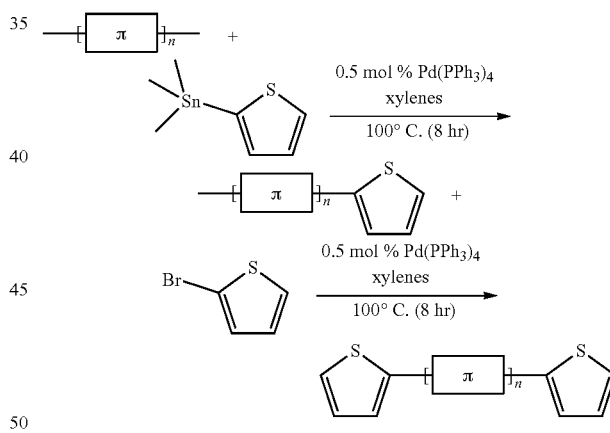

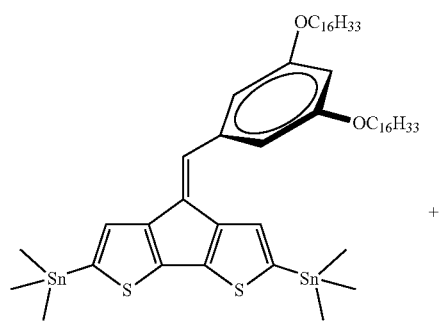

+

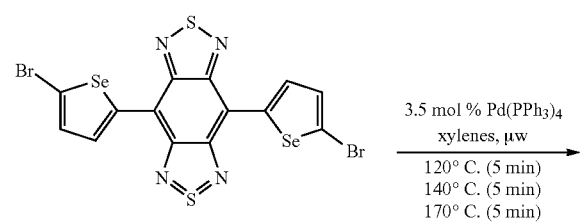

Example 8. This example demonstrates the open-shell character of the polymer backbones in P1, P3, P6, and P7 (Scheme 1) using electron paramagnetic resonance (EPR) spectroscopy and superconducting quantum interference device (SQUID) magnetometry (FIG. 1). The increase in magnetic susceptibility ($\chi$) upon cooling is characteristic of and consistent with materials with open-shell ground states. Inset of FIG. 1 is the room temperature 298 K EPR spectra, which demonstrates that open-shell character is retained in ambient conditions across materials sets.

Figure 2:
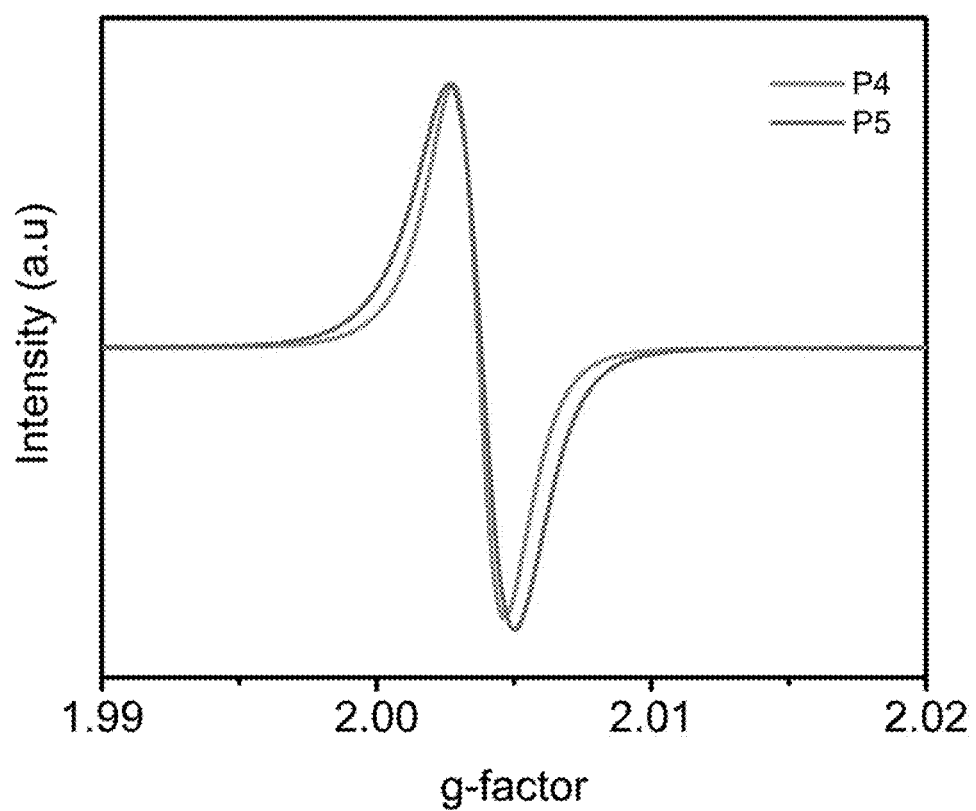
FIG. 2 shows a graphical illustration of the representative electron paramagnetic resonance (EPR) spectroscopy for P4 and P5 indicating the open-shell character of these two polymers.

Example 9. This example demonstrates the open-shell character of the polymer backbones in P4 and P5 (Scheme 1) using electron paramagnetic resonance (EPR) spectroscopy (FIG. 2). The room temperature EPR spectra demonstrate that open-shell character of P4 and P5 is retained in ambient conditions.

Figure 3:
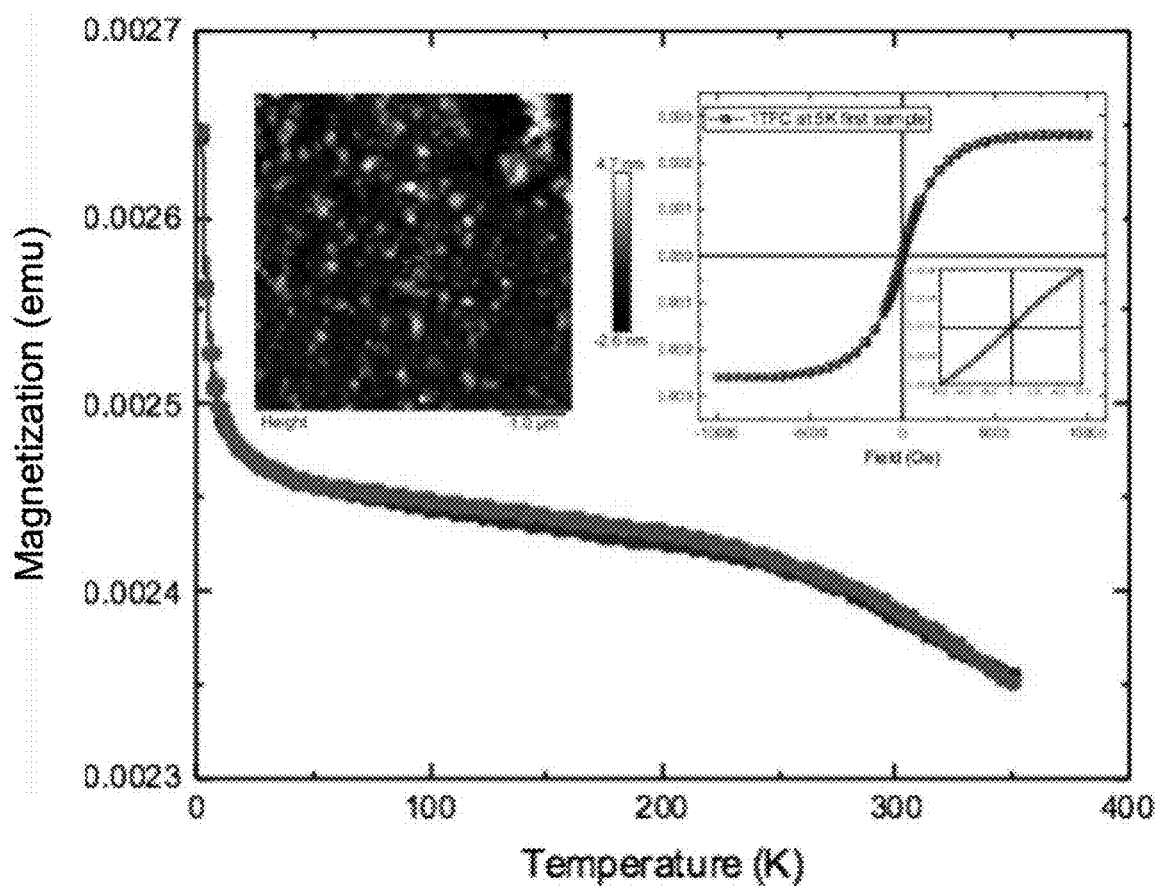
FIG. 3 shows a graphical illustration of the temperature and field-dependent magnetic behavior of P1 can be tuned through morphology control.

Example 10. This example demonstrates that the magnetization measured under an applied field via SQUID can be controlled through processing conditions to yield materials with nanoscale ordered ferromagnetic domains. FIG. 3 shows that temperature-dependent magnetic susceptibility measurements of P1 indicate ordering of nanoscale ferromagnetic domains upon cooling in an applied field. Magnetic force microscopy images demonstrate that this ordering persists at ambient temperature (FIG. 3, inset, left). Field-dependent magnetization indicates a negligible hysteresis effect at low temperature.

Figure 4:
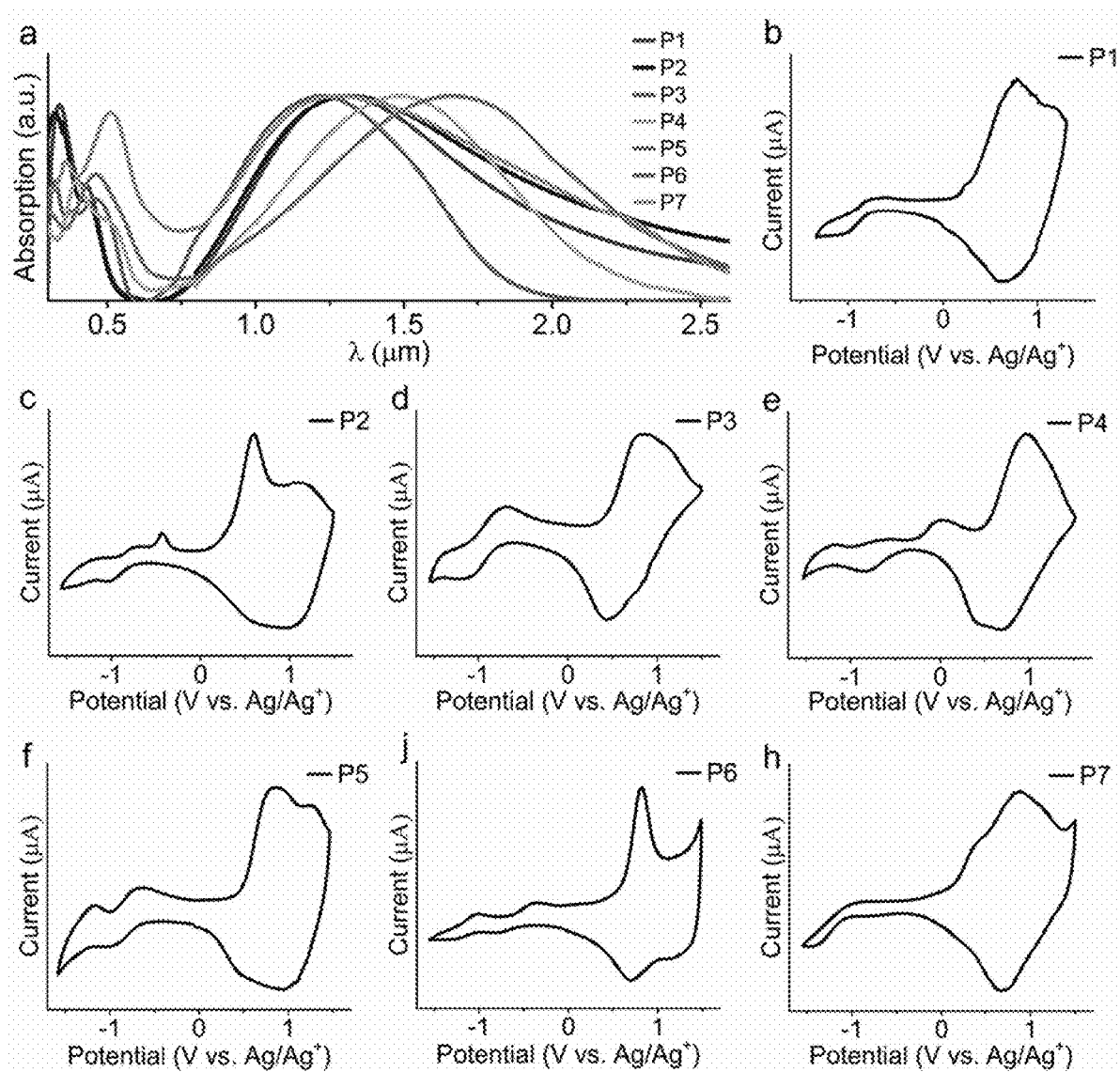
FIG. 4 shows a graphical illustration of the representative thin film absorption spectra and cyclic voltammetry CV data of P1-P7 from the present invention.

Example 11. This example involved recording the solution and thin film absorption spectra and cyclic voltammetry (CV) data (b-h) of P1-P7 (FIG. 4). The extracted optical and electrochemical properties are summarized in Table 1, which indicates the very narrow optical and electrical band gap nature of these polymers. Thin films UV-Vis samples were prepared by spin coating the 10 mg mL$^{-1}$ chlorobenzene ($C_6H_5Cl$) solution onto quartz substrates at 1000 rpm. Solution UV-Vis samples were prepared in $CHCl_3$ in a proper concentration. CV was carried out on drop-cast polymer films at room temperature in degassed anhydrous acetonitrile with tetrabutylammonium hexafluorophosphate (0.1 M) as the supporting electrolyte. The working electrode was a platinum wire, the counter electrode was a platinum wire, and the reference electrode was Ag/AgCl.

TABLE 1

| Polymer | Solution $\lambda_{max}{}^a$ (μm) | Film $\lambda_{max}{}^b$ (μm) | $E_g^{opt\ c}$ [eV] | $E_{HOMO}{}^d$ [eV] | $E_{LUMO}{}^e$ [eV] | $E_g^{elec\ f}$ [eV] |
|---|---|---|---|---|---|---|
| P1 | 1.25 | 1.30 | 0-0.5 | −4.79 | −4.23 | 0.56 |
| P2 | 1.21 | 1.32 | 0-0.5 | −4.65 | −3.95 | 0.70 |
| P3 | 1.15 | 1.23 | 0.66 | −5.15 | −4.00 | 1.15 |
| P4 | 1.38 | 1.46 | 0.59 | −5.52 | −4.35 | 0.9 |
| P5 | 1.46 | 1.66 | 0.54 | −5.07 | −4.27 | 0.8 |
| P6 | 1.18 | 1.29 | 0.50 | −4.85 | −4.00 | 0.85 |
| P7 | 1.40 | 1.49 | 0.44 | −4.5 | −3.65 | 0.85 |

Table 1.
$^a$Dilute solution was made from $CHCl_3$.
$^b$Films spin coated from a $C_6H_5Cl$ solution (10 mg mL$^{-1}$).
$^c$Estimated from the absorption onset of the film.
$^d$$E_{HOMO}$ calculated from the onset of oxidation.
$^e$$E_{LUMO}$ calculated from the onset of reduction.
$^f$$E_g^{elec}$ calculated from the difference between $E_{HOMO}$ and $E_{LUMO}$.

Figure 5:
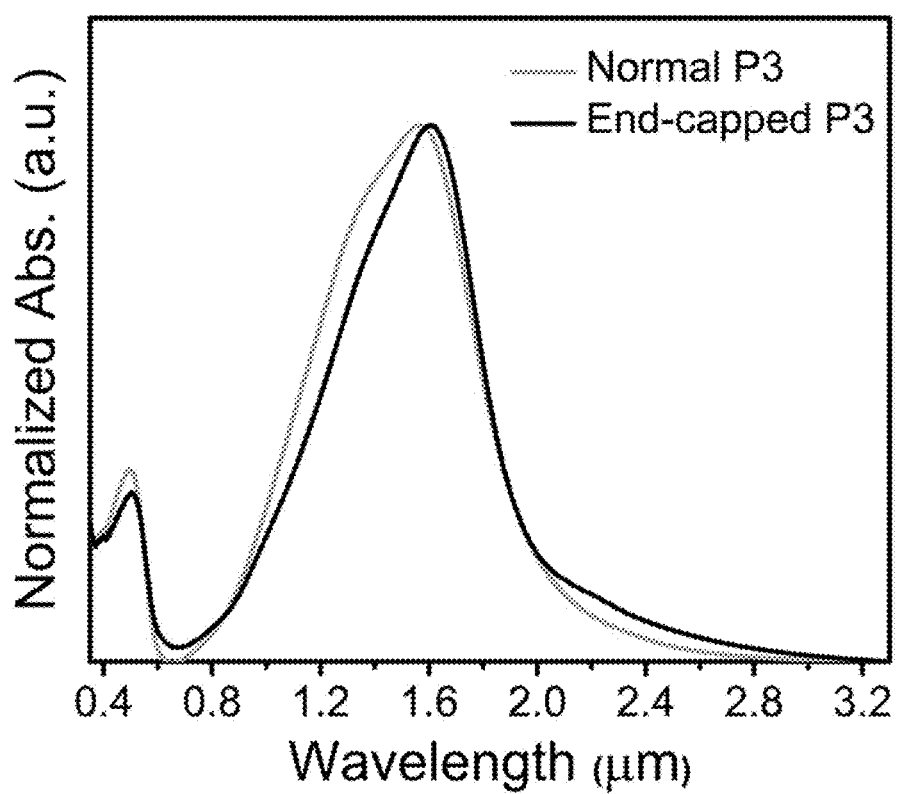
FIG. 5 shows a graphical illustration of the difference of the absorption spectra for the spin-coated film from normal P3 and end-capped P3 batch enclosed in the present invention.

Example 12. This example involved the film absorption spectra difference for spin-coated film in the normal batch and end-capped batch from P3 (FIG. 5). The end-capping process was described in Example 7 and the film UV-Vis method was described in Example 11. After end capping, the absorption max was red shifted from 1.57 to 1.61 μm, which indicates the end-capping process promotes a more ordered packing fashion in the solid film.

Figure 6:
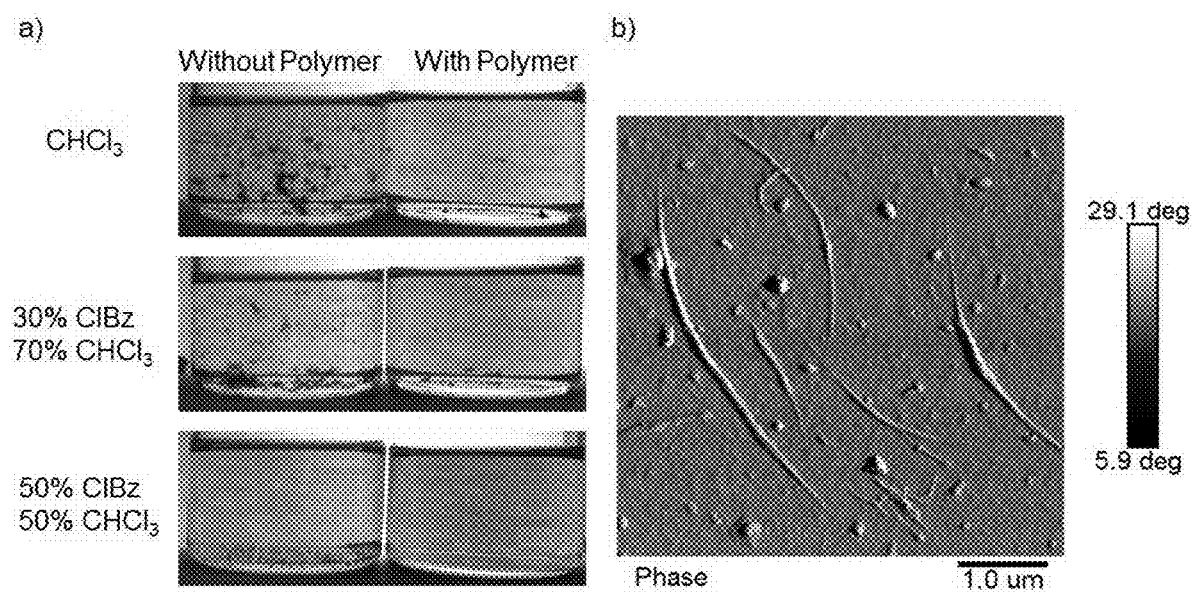
FIG. 6 shows a pictorial representation of the visual inspection of the well-dispersed polymer/SWCNTs suspension and the AFM morphological image of the polymer/SWCNTs composite film from the present invention.

Example 13. This example involved the (a) visual inspection of the conjugated polymer-assisted SWCNTs well dispersed in various organic solvents, without polymer and with polymer, and (b) the AFM imaging of the composite film showing the SWCNTs dispersion in the polymer matrix (FIG. 6). The suspension samples were prepared from 5 mg mL$^{-1}$ P2 polymer solution with 5% SWCNT loading in three different solvents combination. The suspension was sonicated by 30 min in a batch sonication and then placed stilly for days. The image was recorded eight days after. After eight days, the sample from the 50% ClBz and 50% $CHCl_3$ was drop-casted on a Si wafer to perform the AFM morphologic study.

Figure 7:
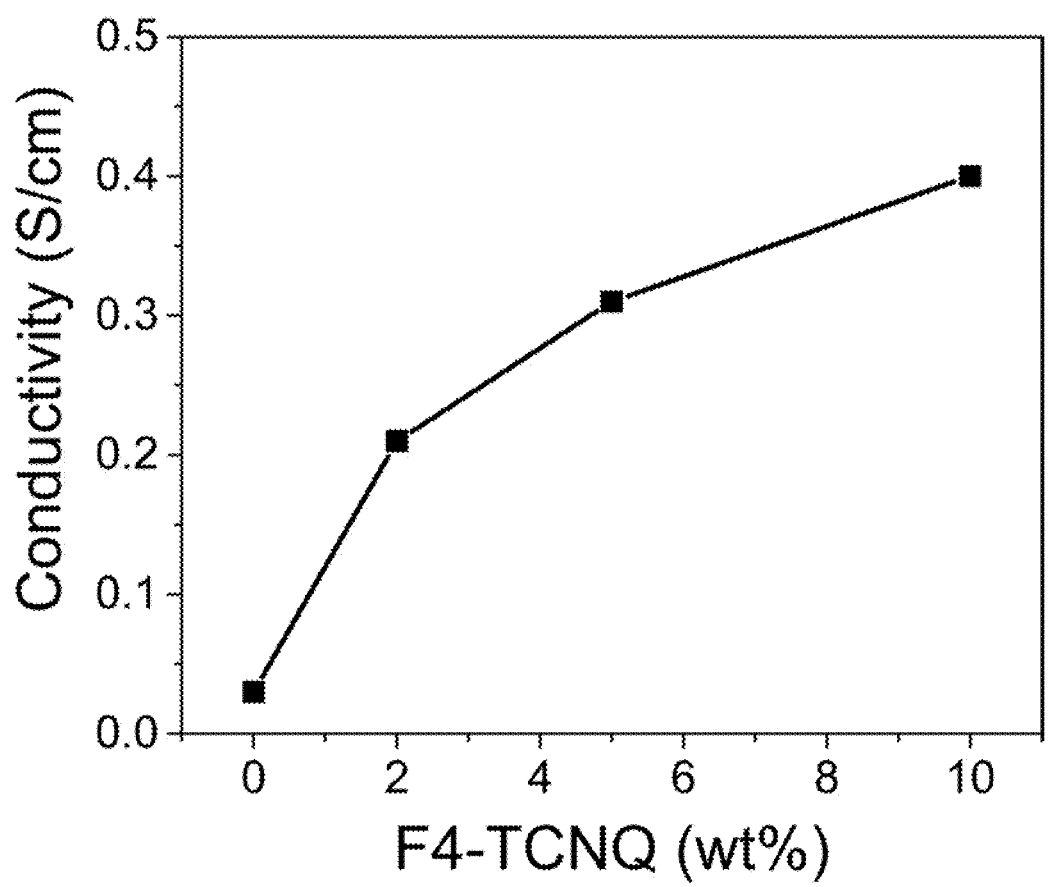
FIG. 7 shows a graphical illustration of the P2 conductivity as a function of the dopant F4-TCNQ at various weight percentages.

Example 14. This example involved the demonstration of the intrinsic conductivity of P2 can be further modulated or enhanced by the introducing of the dopant F4-TCNQ (FIG. 7). F4-TCNQ was mixed with polymer P2 at different loading to make 10 mg mL$^{-1}$ in $CHCl_3$ solution. The conductive film was processed by spin-coating from the above solution at 1000 rpm. The conductivity measurement was carried out on a two-point probe measurement set-up.

Figure 8:
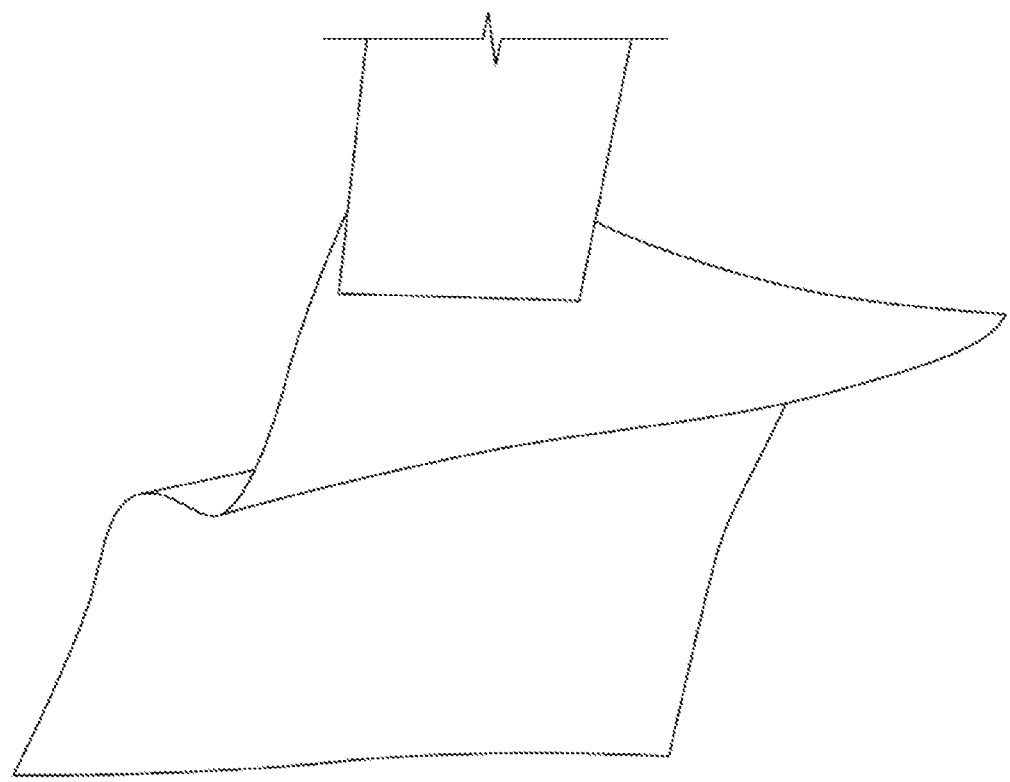
FIG. 8 shows a pictorial representation of a flexible, free-standing composite film.

Example 15. This example involved the visual inspection of a flexible, free-standing conductive film after delaminating from the glass substrate following the free-standing film preparation procedure (FIG. 8). Solution of 20 mg mL$^{-1}$ P2 $CHCl_3$ was drop-casted onto a Si wafer substrate, which was placed in a closed container with a reservoir of $CHCl_3$ solvent. After 8 h, the film was peeled off from the substrate to make the conductive free-standing film.

Figure 9:
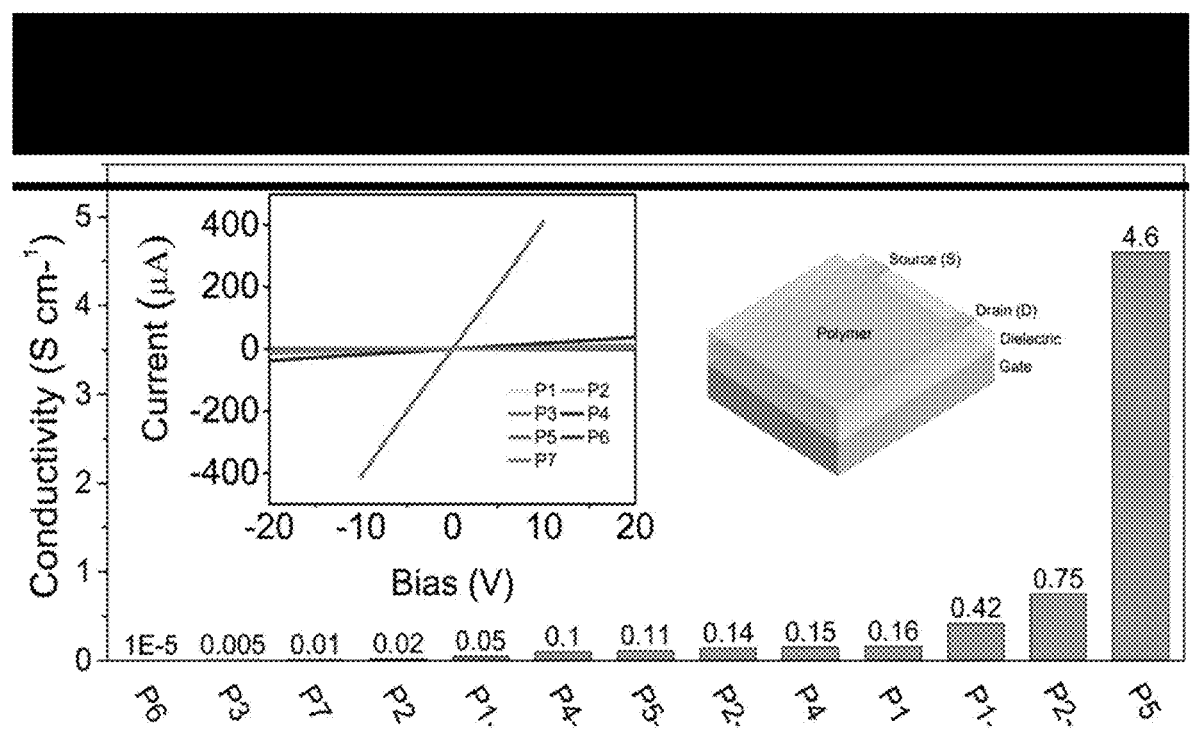
FIG. 9 shows a graphical illustration of the linearity of the I-V curves and the wide range of conductivity as a function of polymer structures across materials sets in the present invention.

Example 16. This example involved the neat thin film conductivity for P1 to P7 and their related derivatives (FIG. 9). Five orders of magnitude conductivity tuneability can be achieved as a function of the polymer structure. The left insert in FIG. 9 demonstrates the linear I-V curves of P1-P7 from two-point probe measurement indicating the intrinsic conductive nature of these polymers. The film samples for the conductivity measurement were prepared from spin-coating 10 mg mL$^{-1}$ polymer/$CHCl_3$ solution to pre-fabricated devices (the device architecture used for the conductivity measurement is illustrated in the right insert in FIG. 9). The I-V curves were recorded by sweeping the voltage from −20V to 20V.

Figure 10:
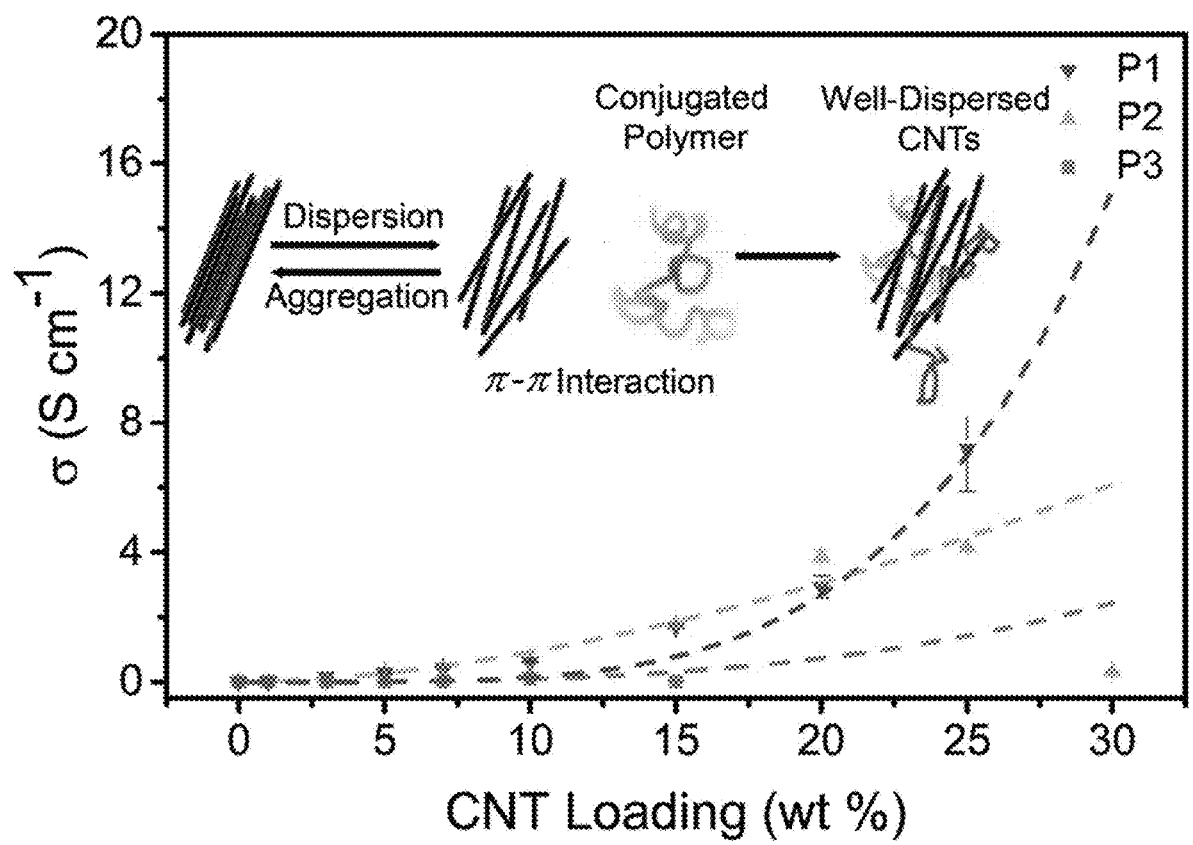
FIG. 10 shows a graphical representation of the composite conductivity as a function of SWCNTs loading and polymer structure P1, P2, and P3.

Example 17. This example involved the conductivity comparison for the composites composed of P1, P2, and P3 individually at various SWCNTs loading (from 0 to 30%) prepared by the slow drying technique: SWCNT and polymer were pre-mixed at the specific loading to make 1.8 mg mL$^{-1}$ $CHCl_3$ suspension. The suspension was sonicated for 30 min before drop-casting onto a pre-fabricated device with the architecture illustrated in FIG. 9. The pre-fabricated device was placed in a closed container with a reservoir of $CHCl_3$ solvent. The film was left in the container overnight before taking out for conductivity measurement. The highest conductivity achieved is 16.3 S cm$^{-1}$ by P1 at 30% SWCNTs loading (FIG. 10).

Figure 11:
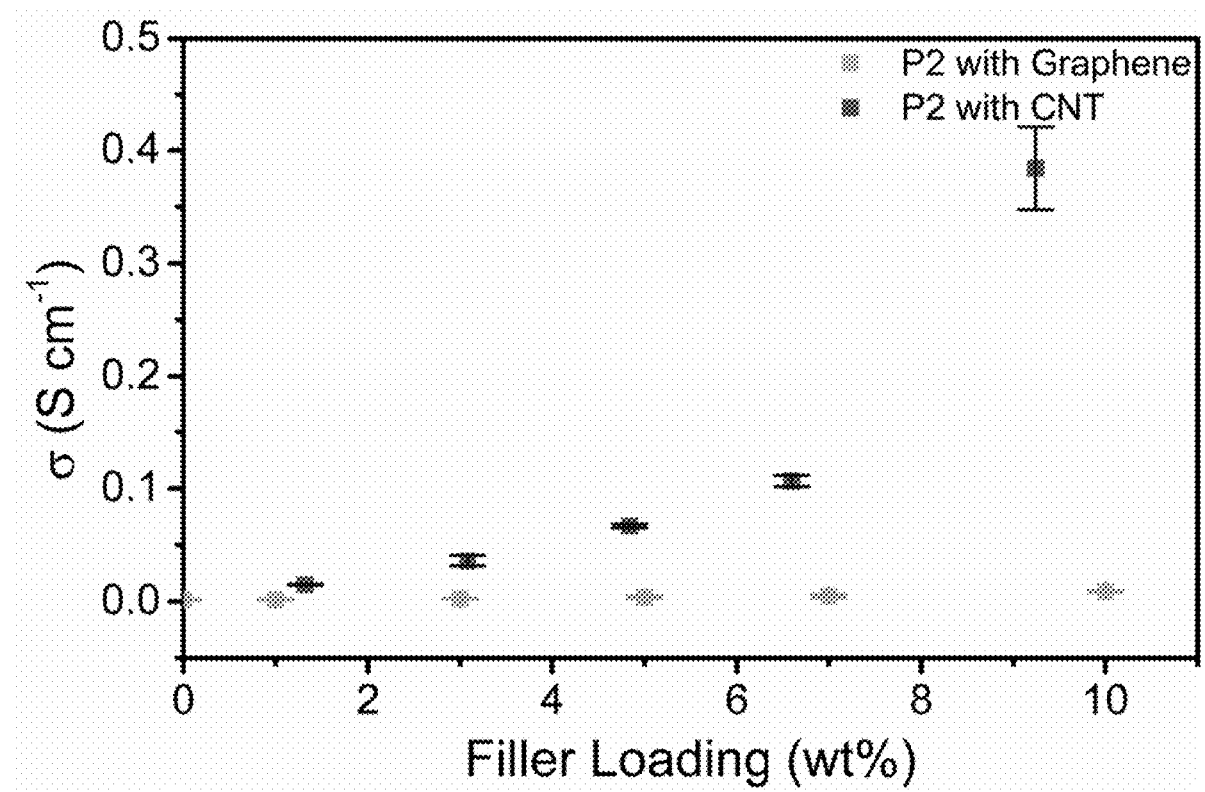
FIG. 11 shows a graphical representation of the P2 composite conductivity as a function of SWCNT and graphene loading.

Example 18. This example involved the composite conductivity (comparison data) composed of P2 at various graphene and SWCNTs loading percentages (FIG. 11). The sample preparation process was described in Example 17. The resultant graphene composite conductivity is lower than the one with SWCNTs at the same loading, mainly due to the lower aspect ratio of the graphene resulting in higher percolation threshold. The conductivity of the graphene composite can be dramatically increased after passing the percolation threshold.

Figure 12:
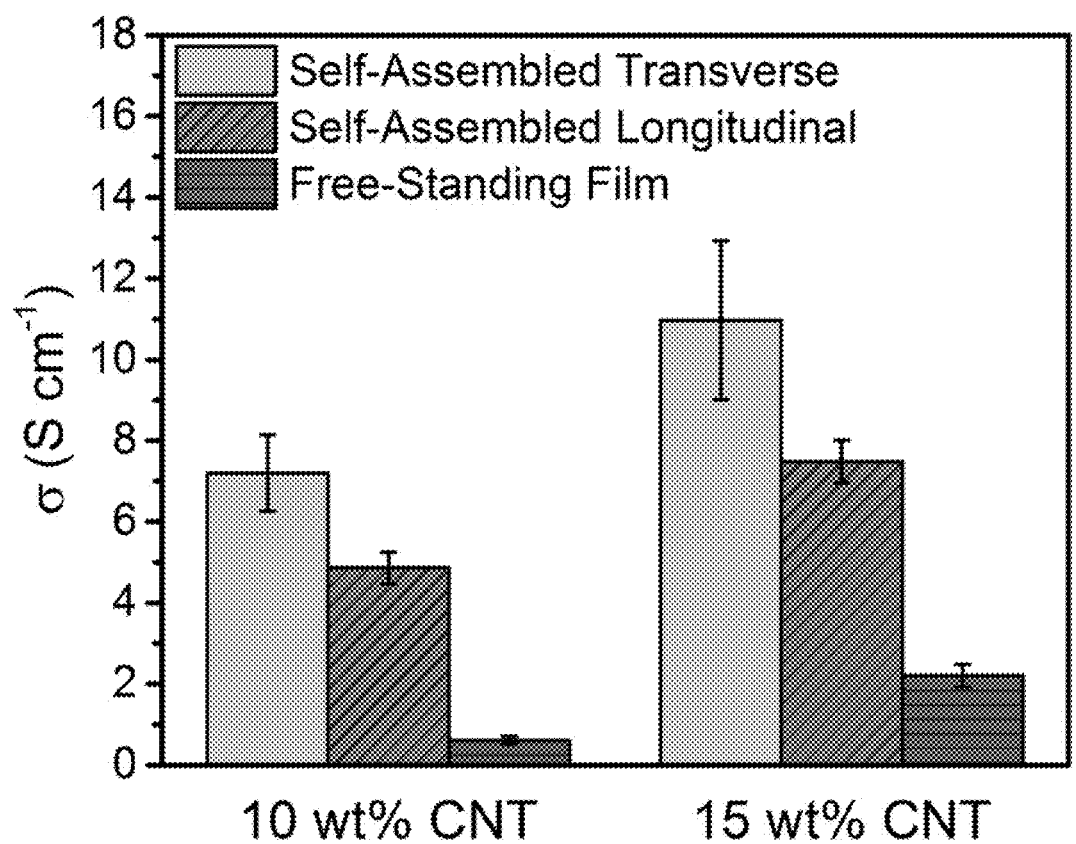
FIG. 12 shows a graphical illustration of the P2/SWCNT composite conductivity as a function of composite film processing techniques in the present invention.

Example 19. This example involved the P2 composite with high anisotropic conductivity prepared from SWCNTs self-assembly method with 10% and 15% SWCNTs loading (FIG. 12). SWCNT and polymer were pre-mixed at the specific loading to make a 1.8 mg mL$^{-1}$ $CHCl_3$ suspension. The suspension was sonicated for 30 min. The pre-fabricated device with the architecture illustrated in FIG. 9 was placed vertically and submerged in the above suspensions in an open container. The device was taken out for conductivity measurement after the suspensions were completely evaporated. A significant conductivity difference in the transverse and longitudinal direction of the film is observed and the conductivity from either direction is one order of magnitude higher than the composite conductivity prepared from a normal free-standing method without SWCNTs self-assembly. The conductivity is expected to increase further when SWCNTs loading increases beyond 15%.

Figure 13:
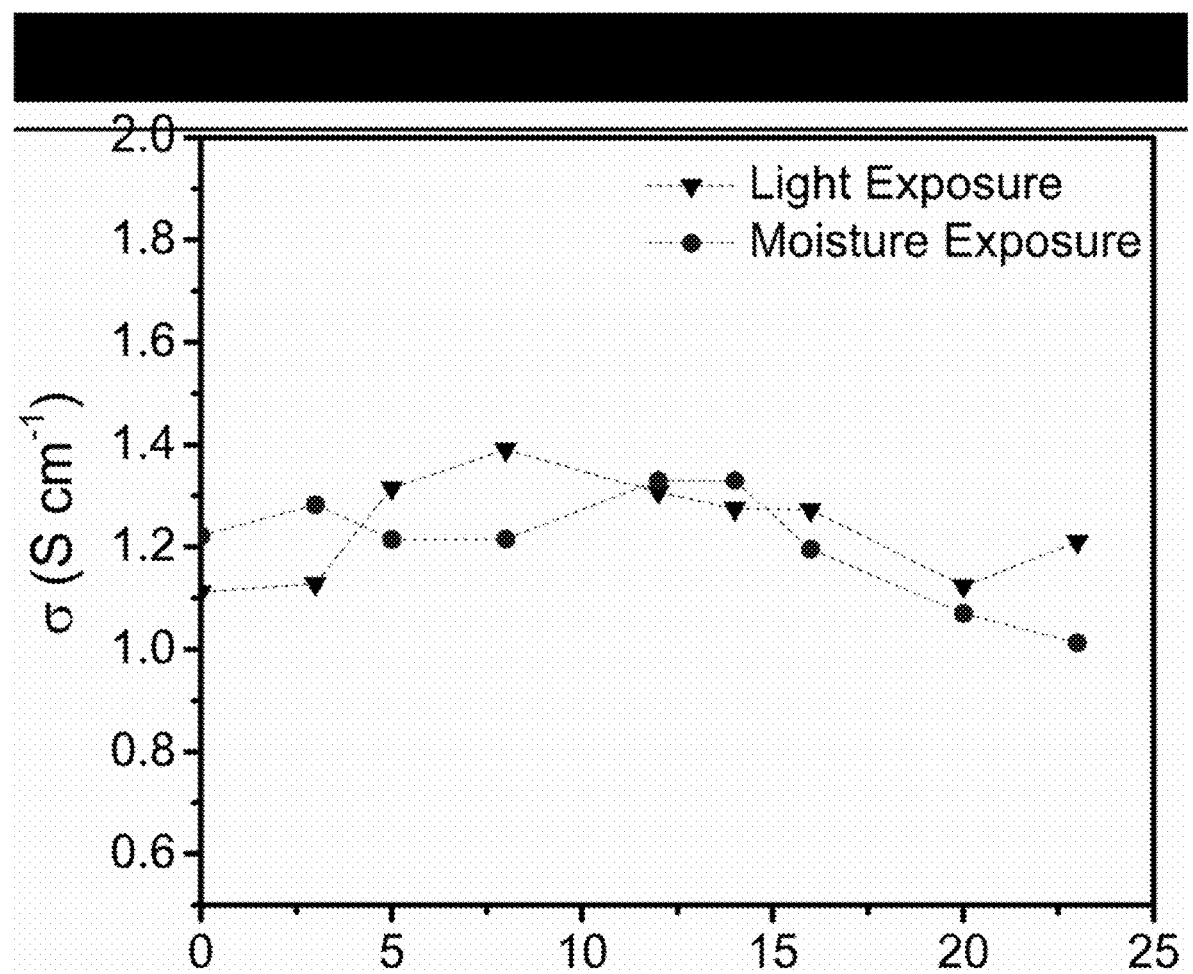
FIG. 13 shows a graphical illustration of the long-term stability of the conductivity disclosed in the present invention under different weathering conditions.

Example 20. This example involved the continuous weathering stability study for the composite prepared from P2 with 10% SWCNTs loading, and the sample preparation process was described in Example 17 (FIG. 13). The conductivity at the level of 1 S cm$^{-1}$ retained for 23 days after exposing to different environmental conditions, including light and heavy moisture.

Example 21. This example involved the discrete weathering stability study (initial and after one year) for the pristine and SWCNT-based composite prepared from P1 and P2 with 10% SWCNTs loading (Table 2). The sample preparation process was described in Example 17. The resultant resistivity retained at the same order of magnitude after exposing the samples in the air and light for one year.

TABLE 2

Aged Composite Films' Sheet Resistivity

| Sample | Rs Initial (kOhm Sq$^{-1}$) | Rs after one year (kOhm Sq$^{-1}$) |
| --- | --- | --- |
| P2 pristine free-standing film | 196 | 106.9 |
| P2/SWCNT composite film | 6.2 | 4.1 |
| P1 pristine free-standing film | 5560 | 3260.4 |
| P1/SWCNT composite film | 236 | 143.9 |

Table 2. The discrete weathering stability study for the pristine and SWCNT-based composite film prepared from P1 and P2 with 10% SWCNTs loading.

All parameters presented herein including, but not limited to, sizes, dimensions, times, temperatures, pressures, amounts, distances, quantities, ratios, weights, volumes, percentages, and/or similar features and data and the like, for example, represent approximate values and can vary with the possible embodiments described and those not necessarily described but encompassed by the invention. Recitations of numerical values and/or numerical ranges can be read to include the term 'about'. Further, references to 'a' or 'an' concerning any particular item, component, material, or product is defined as at least one and could be more than one. The terms 'comprises' and 'includes' and variations thereof are not to have a limiting meaning.

The above detailed description is presented to enable any person skilled in the art to make and use the invention. Specific details have been revealed to provide a comprehensive understanding of the present invention and are used for explanation of the information provided. These specific details, however, are not required to practice the invention, as is apparent to one skilled in the art. Descriptions of specific applications, methods, analyses, materials, components, dimensions, compositions, and calculations are meant to serve only as representative examples. Various modifications to the preferred embodiments may be readily apparent to one skilled in the art, and the general principles defined herein may be applicable to other embodiments and applications while still remaining within the scope of the invention. There is no intention for the present invention to be limited to the embodiments shown and the invention is to be accorded the widest possible scope consistent with the principles and features disclosed herein.

While various embodiments of the present invention have been described above, it should be understood that they have been presented by way of example and not limitation. It will be apparent to persons skilled in the relevant art(s) that various changes in form and detail can be made therein without departing from the spirit and scope of the present invention. In fact, after reading the above description, it will be apparent to one skilled in the relevant art(s) how to implement the invention in alternative embodiments. All embodiments herein can be made without undue experimentation in light of the disclosure. The Applicants have described the preferred embodiments of the invention, but it should be understood that the broadest scope of the invention includes such modifications as additional or different methods and materials. Many other advantages of the invention will be apparent to those skilled in the art from the above descriptions and the subsequent claims. Thus, the present invention should not be limited by any of the above-described exemplary embodiments.

The processes, systems, methods, products, compositions, structures, configurations, and compounds of the present invention are often best practiced by empirically determining the appropriate values of the operating parameters or by conducting simulations to arrive at best design for a given application. Accordingly, all suitable modifications, combinations, and equivalents should be considered as falling within the spirit and scope of the invention.

REFERENCES

1. Das, R.; Harrop, P., Printed, organic & flexible electronics: forecasts, players & opportunities 2013-2023. *Cambridge: IDTechEx* 2013.
2. Chang, J. S.; Facchetti, A. F.; Reuss, R., A Circuits and Systems Perspective of Organic/Printed Electronics: Review, Challenges, and Contemporary and Emerging Design Approaches. *IEEE Journal on Emerging and Selected Topics in Circuits and Systems* 2017, 7, 7-26.
3. Lv, P.; Zhao, Y.; Liu, F.; Li, G.; Dai, X.; Ji, X.; Dong, Z.; Qiu, X., Fabrication of polyaniline/polyimide composite fibers with electrically conductive properties. *Appl. Surf. Sci.* 2016, 367, 335-341.
4. Seyedin, S.; Razal, J. M.; Innis, P. C.; Jeiranikhameneh, A.; Beirne, S.; Wallace, G. G., Knitted Strain Sensor Textiles of Highly Conductive All-Polymeric Fibers. *ACS Appl. Mater. Interfaces* 2015, 7, 21150-21158.
5. Wang, Y.; Jing, X., Intrinsically conducting polymers for electromagnetic interference shielding. *Polym. Adv. Technol.* 2005, 16, 344-351.
6. Geffroy, B.; le Roy, P.; Prat, C., Organic light-emitting diode (OLED) technology: materials, devices and display technologies. *Polymer International* 2006, 55, 572-582.
7. Cheng, Y.-J.; Yang, S.-H.; Hsu, C.-S., Synthesis of Conjugated Polymers for Organic Solar Cell Applications. *Chem. Rev.* 2009, 109, 5868-5923.
8. Baeg, K.-J.; Binda, M.; Natali, D.; Caironi, M.; Noh, Y.-Y., Organic Light Detectors: Photodiodes and Phototransistors. *Adv. Mater.* 2013, 25, 4267-4295.
9. Ostroverkhova, O., Organic Optoelectronic Materials: Mechanisms and Applications. *Chem. Rev.* 2016, 116, 13279-13412.
10. Arias, A. C.; MacKenzie, J. D.; McCulloch, I.; Rivnay, J.; Salleo, A., Materials and Applications for Large Area Electronics: Solution-Based Approaches. *Chem. Rev.* 2010, 110, 3-24.
11. AlSalhi, M. S.; Alam, J.; Dass, L. A.; Raja, M., Recent Advances in Conjugated Polymers for Light Emitting Devices. *International Journal of Molecular Sciences* 2011, 12, 2036.
12. Snook, G. A.; Kao, P.; Best, A. S., Conducting-polymer-based supercapacitor devices and electrodes. *J. Power Sources* 2011, 196, 1-12.
13. Kroon, R.; Mengistie, D. A.; Kiefer, D.; Hynynen, J.; Ryan, J. D.; Yu, L.; Muller, C., Thermoelectric plastics: from design to synthesis, processing and structure-property relationships. *Chem. Soc. Rev.* 2016, 45, 6147-6164.

14. Culebras, M.; Gómez, C.; Cantarero, A., Review on Polymers for Thermoelectric Applications. *Materials* 2014, 7, 6701.
15. Wang, C.; Dong, H.; Hu, W.; Liu, Y.; Zhu, D., Semiconducting π-Conjugated Systems in Field-Effect Transistors: A Material Odyssey of Organic Electronics. *Chem. Rev.* 2012, 112, 2208-2267.
16. Zhu, C.; Liu, L.; Yang, Q.; Lv, F.; Wang, S., Water-Soluble Conjugated Polymers for Imaging, Diagnosis, and Therapy. *Chem. Rev.* 2012, 112, 4687-4735.
17. Feng, L.; Zhu, C.; Yuan, H.; Liu, L.; Lv, F.; Wang, S., Conjugated polymer nanoparticles: preparation, properties, functionalization and biological applications. *Chem. Soc. Rev.* 2013, 42, 6620-6633.
18. Bauhofer, W.; Kovacs, J. Z., A review and analysis of electrical percolation in carbon nanotube polymer composites. *Compos. Sci. Technol.* 2009, 69, 1486-1498.
19. Gu, H.; Swager, T. M., Fabrication of Free-standing, Conductive, and Transparent Carbon Nanotube Films. *Adv. Mater.* 2008, 20, 4433-4437.
20. Nabet, B., *Photodetectors: Materials, Devices and Applications*. Woodhead Publishing, 2015.
21. Babinec, S. J.; Sen, A.; Drumright, R. E., Electronically-conductive polymers. W.O. Patent 9/919/883, Apr. 22, 1999.
22. Shi, H.; Liu, C.; Jiang, Q.; Xu, J., Effective Approaches to Improve the Electrical Conductivity of PEDOT:PSS: A Review. *Adv. Elec. Mater.* 2015, 1, 1500017-n/a.
23. Tasis, D.; Tagmatarchis, N.; Bianco, A.; Prato, M Chemistry of Carbon Nanotubes. *Chem. Rev.* 2006, 106, 1105-1136.
24. Liu, Z.; Bai, G.; Huang, Y.; Ma, Y.; Du, F.; Li, F.; Guo, T.; Chen, Y., Reflection and absorption contributions to the electromagnetic interference shielding of single-walled carbon nanotube/polyurethane composites. *Carbon* 2007, 45, 821-827.
25. Bounioux, C.; Katz, E. A.; Yerushalmi-Rozen, R., Conjugated polymers—carbon nanotubes-based functional materials for organic photovoltaics: a critical review. *Polym. Adv. Technol.* 2012, 23, 1129-1140.
26. Samanta, S. K.; Fritsch, M.; Scherf, U.; Gomulya, W.; Bisri, S. Z.; Loi, M. A., Conjugated Polymer-Assisted Dispersion of Single-Wall Carbon Nanotubes: The Power of Polymer Wrapping. *Ace. Chem. Res.* 2014, 47, 2446-2456.
27. O'connell, M. J.; Bachilo, S. M.; Huffman, C. B.; Moore, V. C.; Strano, M. S.; Haroz, E. H.; Rialon, K. L.; Boul, P. J.; Noon, W. H.; Kittrell, C., Band gap fluorescence from individual single-walled carbon nanotubes. *Science* 2002, 297, 593-596.
28. Zheng, M.; Jagota, A.; Semke, E. D.; Diner, B. A.; Mclean, R. S.; Lustig, S. R.; Richardson, R. E.; Tassi, N. G., DNA-assisted dispersion and separation of carbon nanotubes. *Nat. Mater.* 2003, 2, 338.
29. Chen, Z.; Du, X.; Du, M.-H.; Rancken, C. D.; Cheng, H.-P.; Rinzler, A. G., Bulk separative enrichment in metallic or semiconducting single-walled carbon nanotubes. *Nano Lett.* 2003, 3, 1245-1249.
30. Arnold, M. S.; Green, A. A.; Hulvat, J. F.; Stupp, S. I.; Hersam, M. C., Sorting carbon nanotubes by electronic structure using density differentiation. *Nat. Nano* 2006, 1, 60-65.
31. Lemasson, F. A.; Strunk, T.; Gerstel, P.; Hennrich, F.; Lebedkin, S.; Barner-Kowollik, C.; Wenzel, W.; Kappes, M. M.; Mayor, M., Selective Dispersion of Single-Walled Carbon Nanotubes with Specific Chiral Indices by Poly (N-decyl-2,7-carbazole). *J. Am. Chem. Soc.* 2011, 133, 652-655.
32. Graf, A.; Zakharko, Y.; Schießl, S. P.; Backes, C.; Pfohl, M.; Flavel, B. S.; Zaumseil, J., Large scale, selective dispersion of long single-walled carbon nanotubes with high photoluminescence quantum yield by shear force mixing. *Carbon* 2016, 105, 593-599.
33. Suckeveriene, R. Y.; Zelikman, E.; Narkis, M., Hybrid Electrically Conducting Nano Composites Comprising Carbon Nanotubes/Intrinsically Conducting Polymer Systems. *Wiley Encyclopedia of Composites* 2012.
34. Na, J. Y.; Kang, B.; Lee, S. G.; Cho, K.; Park, Y. D., Surface-Mediated Solidification of a Semiconducting Polymer during Time-Controlled Spin-Coating. *ACS Appl. Mater. Interfaces* 2017, 9, 9871-9879.

What is claimed is:

1. A method of preparing a conjugated copolymer with unpaired electrons, the method comprising:
    copolymerizing an electron rich, donor monomer with an electron deficient pro-quinoidal acceptor monomer to provide the conjugated copolymer with a narrow bandgap of 0 Ev-0.66 Ev, diradical or multiple diradical character, and unpaired electrons in orbitals of different energies; and
    optionally end-capping the conjugated copolymer;
    wherein the conjugated copolymer provides an open-shell ground state with a singlet or triplet spin multiplicity; and
    the copolymer that is prepared comprises a copolymer structure exhibiting open-shell character consisting of alternating donor-acceptor monomers and is selected from copolymers of the Formulae (I)-(VIII):

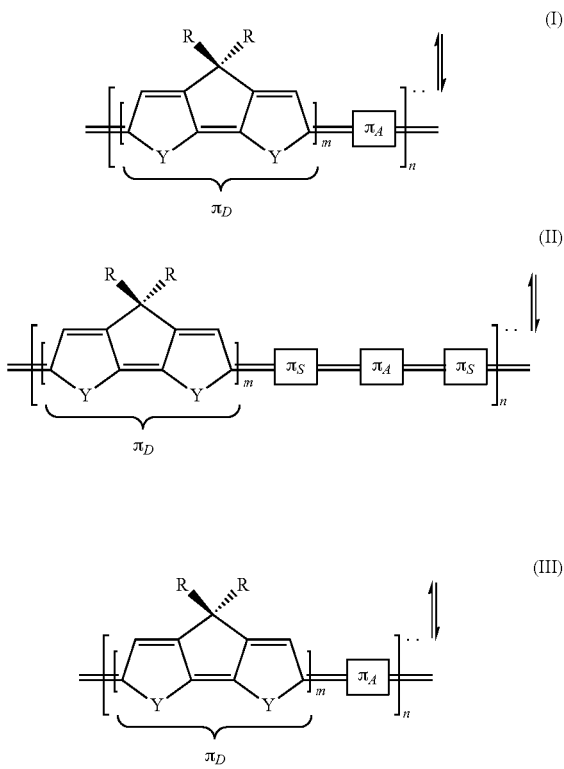

(IV)

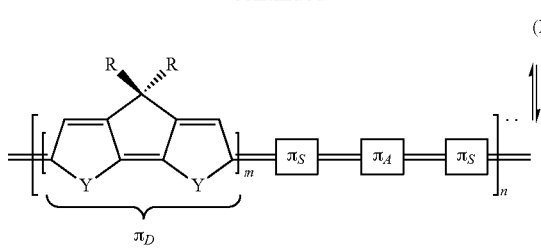

wherein in formulae (I)-(IV), $\pi_D$ is the donor monomer and is selected from the group consisting of cyclopentadithiophene and cyclopentadiselenophene comprising a substituent R, wherein R is selected from the group consisting of unsubstituted $C_1$-$C_{36}$ hydrocarbyl, substituted $C_1$-$C_{36}$ hydrocarbyl, substituted $C_6$-$C_{20}$ aryl, substituted $C_3$-$C_{20}$ heteroaryl, unsubstituted $C_0$-$C_{36}$ hydrocarbylene $C_6$-$C_{20}$ aryl-$C_0$-$C_{36}$ hydrocarbyl, substituted $C_0$-$C_{36}$ hydrocarbylene $C_6$-$C_{20}$ aryl $C_0$-$C_{36}$ hydrocarbyl, —F, —Cl, —Br, —I, —CN, —$SR_2$, —OR, —COOR, and —$NR_2R_3$, where $R_2$ and $R_3$ are independently selected from a $C_1$-$C_{24}$ hydrocarbyl group;

(V)

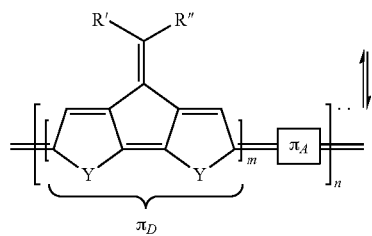

(VI)

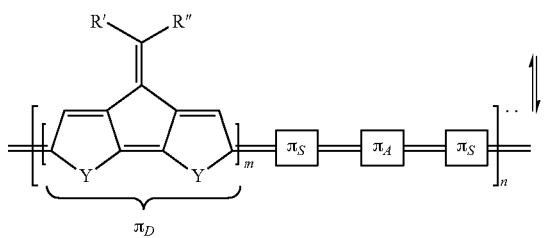

(VII)

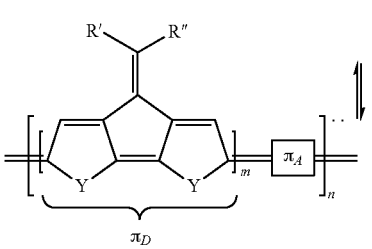

(VIII)

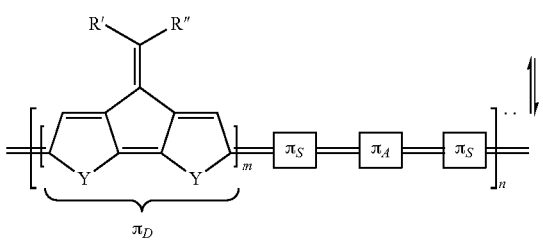

wherein for formulas (V)-(VIII), Ro is the donor monomer and is selected from the group consisting of cyclopentadithiophene and cyclopentadiselenophene comprising substituents R' and R", wherein R' and R" are each independently selected from the group consisting of unsubstituted $C_1$-$C_{36}$ hydrocarbyl, substituted $C_1$-$C_{36}$ hydrocarbyl, substituted $C_6$-$C_{20}$ aryl, substituted $C_3$-$C_{20}$ heteroaryl, unsubstituted $C_0$-$C_{36}$ hydrocarbylene $C_6$-$C_{20}$ aryl-$C_0$-$C_{36}$ hydrocarbyl, substituted $C_0$-$C_{36}$ hydrocarbylene $C_6$-$C_{20}$ aryl $C_0$-$C_{36}$ hydrocarbyl, —F, —Cl, —Br, —I, —CN, —$R_2$, —$SR_2$, —$OR_2$, —$COOR_2$, and —$NR_2R_3$, where $R_2$ and $R_3$ are independently selected from a $C_1$-$C_{24}$ hydrocarbyl group; wherein for Formulae (I)-(VIII):

↑↑ represents a triplet state, ↓↑ and represents a singlet state, $\pi_S$ is a conjugated spacer, $\pi_A$ is a moiety that is electron deficient, highly planar, pro-quinoidal, induces a transition from an aromatic electronic state to the quinoidal state, narrows the band gap, lowers $\Delta E_{ST}$, and enhances the multiple diradical character $y_i$ thus promoting open-shell character, and wherein $\pi_A$ is selected from substituted and unsubstituted moieties selected from the group consisting of thiadiazoloquinoxaline, quinoxaline, thienothiadiazole, thienopyridine, thienopyrazine, pyrazinoquinoxaline, benzothiadiazole, bis-benzothiadiazole, benzobisthiadiazole, thiazole, thiadiazolothienopyraz in e, diketopyrrolopyrrole, and combinations thereof and tunability of $y_i$ can be achieved through the introduction of $\pi_S$, and, for Formulae (VII)-(VIII), the multiple diradical character $y_i$ promotes open-shell character while stabilizing the triplet state relative to the singlet state;

Y of $\pi_D$ is selected from the group consisting of, S and Se; m of $\pi_D$ is either 1 or 2, n of the copolymer is an integer >1, and the resulting copolymer of formulae (I), (II), (V), and (VI) exhibits a singlet open-shell electronic ground state defined by an $S_0$ electronic state lying below $T_1$, and the resulting copolymer of formulae (III), (IV), (VII), and (VIII) exhibits a triplet open-shell electronic ground state defined by a $T_0$ electronic state lying below $S_1$, wherein the optional end-capped copolymer structure has the formula:

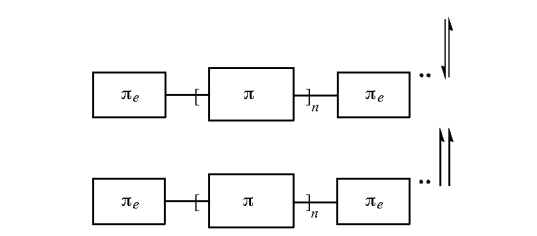

wherein $\pi_n$ is the copolymer, and $\pi_e$ is any substituted and unsubstituted moiety selected from the group consisting of thiophene, bithiophene, dithienothiophene, selenophene, biselenophene, diselenoselenophene, cyclopentadithiophene, cyclopentadiselenophene, and any combination thereof, as well as unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene, substituted $C_0$-$C_{36}$ hydrocarbylene, —F, —Cl, —Br, —I, —CN, —$R_2$, —$SR_2$, —OH, —$OR_2$, —COOH, —$COOR_2$, —$NH_2$, —$NHR_2$, and —$NR_2R_3$, where $R_2$ and $R_3$ of $\pi_e$ are independently selected from a $C_1$-$C_{24}$ hydrocarbyl group, and wherein substituted derivatives of $\pi_e$ comprise hydrocarbyl, aryl, heteroaryl, or hydrocarbylene substituents functionalized with one or multiple R groups selected from the group consisting of a substituted $C_1$-$C_{24}$ hydrocarbyl group, and any combination thereof.

2. The method of claim 1, wherein the copolymer that is prepared comprises the copolymer structure selected from the Formulae (I)-(II):

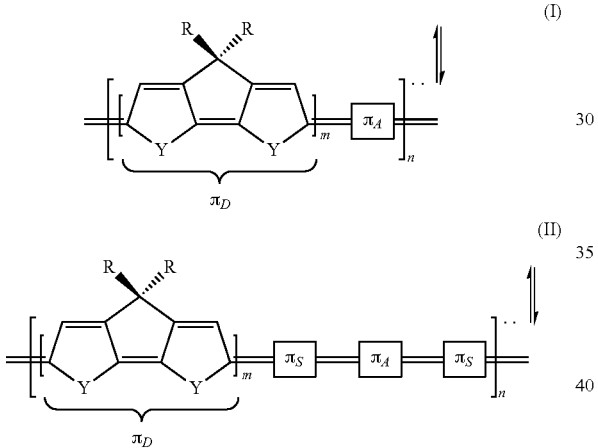

wherein $\pi_D$ is the donor monomer and is selected from the group consisting of cyclopentadithiophene and cyclopentadiselenophene comprising a substituent R, wherein R is selected from the group consisting of unsubstituted $C_1$-$C_{36}$ hydrocarbyl, substituted $C_1$-$C_{36}$ hydrocarbyl, substituted $C_6$-$C_{20}$ aryl, substituted $C_3$-$C_{20}$ heteroaryl, unsubstituted $C_0$-$C_{36}$ hydrocarbylene $C_6$-$C_{20}$ aryl-$C_0$-$C_{36}$ hydrocarbyl, substituted $C_0$-$C_{36}$ hydrocarbylene $C_6$-$C_2$ aryl $C_0$-$C_{36}$ hydrocarbyl, —F, —Cl, —Br, —I, —CN, —$SR_2$, —OR, —COOR, and —$NR_2R_3$, where $R_2$ and $R_3$ are independently selected from a $C_1$-$C_{24}$ hydrocarbyl group;

wherein ↓↑ represents a singlet state, $\pi_S$ is a conjugated spacer, $\pi_A$ is a moiety that is electron deficient, highly planar, pro-quinoidal, induces a transition from an aromatic electronic state to the quinoidal state, narrows the band gap, lowers $\Delta E_{ST}$, and enhances the multiple diradical character $y_i$, thus promoting open-shell character, and wherein $\pi_A$ is selected from substituted and unsubstituted moieties selected from the group consisting of thiadiazoloquinoxaline, quinoxaline, thienothiadiazole, thienopyridine, thienopyrazine, pyrazinoquinoxaline, benzothiadiazole, bis-benzothiadiazole, benzobisthiadiazole, thiazole, thiadiazolothienopyraz in e, diketopyrrolopyrrole, and combinations thereof and tunability of $y_i$ can be achieved through the introduction of $\pi_S$, Y of $\pi_D$ is selected from the group consisting of, S and Se; m of $\pi_D$ is either 1 or 2, n of the copolymer is an integer >1, and the resulting copolymer exhibits a singlet open-shell electronic ground state defined by an $S_0$ electronic state lying below $T_1$, and wherein the optional end-capped copolymer structure has the formula:

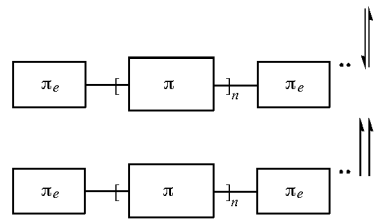

wherein -(π)-$_n$ is the copolymer and;

wherein ↑↑ represents a triplet state, and $\pi_e$ is any substituted and unsubstituted moiety selected from the group consisting of thiophene, bithiophene, dithienothiophene, selenophene, biselenophene, diselenoselenophene, cyclopentadithiophene, cyclopentadiselenophene, and any combination thereof, as well as unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene, substituted $C_0$-$C_{36}$ hydrocarbylene, —F, —Cl, —Br, —I, —CN, —$R_2$, —$SR_2$, —OH, —$OR_2$, —COOH, —$COOR_2$, —$NH_2$, —$NHR_2$, and —$NR_2R_3$, where $R_2$ and $R_3$ of $\pi_e$ are independently selected from a $C_1$-$C_{24}$ hydrocarbyl group, and wherein substituted derivatives of $\pi_e$ comprise hydrocarbyl, aryl, heteroaryl, or hydrocarbylene substituents functionalized with one (or multiple) R groups selected from a substituted $C_1$-$C_{24}$ hydrocarbyl group, or any combination thereof.

3. The method of claim 1, wherein the copolymer that is prepared comprises the copolymer structure selected from the Formulae (III)-(IV):

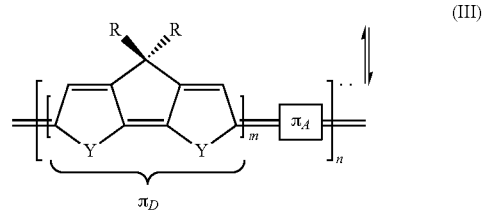

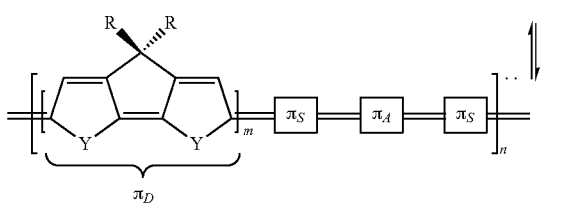

wherein $\pi_D$ is the donor monomer and is selected from the group consisting of cyclopentadithiophene and cyclopentadiselenophene comprising a substituent R, wherein R is selected from the group consisting of unsubstituted $C_1$-$C_{36}$ hydrocarbyl, substituted $C_1$-$C_{36}$ hydrocarbyl, substituted $C_6$-$C_{20}$ aryl, substituted $C_3$-$C_{20}$ heteroaryl, unsubstituted $C_0$-$C_{36}$ hydrocarbylene $C_6$-$C_{20}$ aryl-$C_0$-$C_{36}$ hydrocarbyl, substituted $C_0$-$C_{36}$ hydrocarbylene $C_6$-$C_{20}$ aryl $C_0$-$C_{36}$ hydrocarbyl, —F, —Cl, —Br, —I, —CN, —SR$_2$, —OR, —COOR, and —NR$_2$R$_3$, where R$_2$ and R$_3$ are independently selected from a $C_1$-$C_{24}$ hydrocarbyl group;

wherein ↑↑ represents a triplet state, $\pi_S$ is a conjugated spacer, $\pi_A$ is a moiety that is electron deficient, highly planar, pro-quinoidal, induces a transition from an aromatic electronic state to the quinoidal state, narrows the band gap, lowers $\Delta E_{ST}$, and enhances the multiple diradical character $y_i$ thus promoting open-shell character, and wherein $\pi_A$ is selected from substituted and unsubstituted moieties selected from the group consisting of thiadiazoloquinoxaline, quinoxaline, thienothiadiazole, thienopyridine, thienopyrazine, pyrazinoquinoxaline, benzothiadiazole, bis-benzothiadiazole, benzobisthiadiazole, thiazole, thiadiazolothienopyraz in e, diketopyrrolopyrrole, and combinations thereof and tunability of $y_i$ can be achieved through the introduction of $\pi_S$;

Y of $\pi_D$ is selected from the group consisting of, S and Se; m of $\pi_D$ is 1 or 2, n of the copolymer is an integer >1, and the resulting copolymer exhibits a triplet open-shell electronic ground state defined by a $T_0$ electronic state lying below $S_1$, and wherein the optional end-capped copolymer structure has the formula:

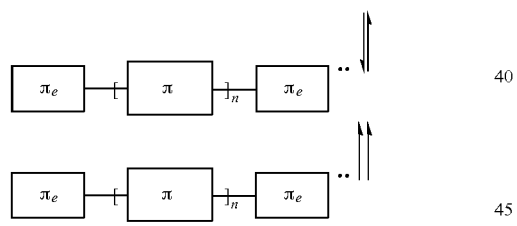

wherein -($\pi$)-$_n$ is the copolymer and;

wherein ↑↑ represents a triplet state, and ↓↑ represents a singlet state, $\pi_e$ is any substituted and unsubstituted moiety selected from the group consisting of thiophene, bithiophene, dithienothiophene, selenophene, biselenophene, diselenoselenophene, cyclopentadithiophene, cyclopentadiselenophene, and any combination thereof, as well as unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene, substituted $C_0$-$C_{36}$ hydrocarbylene, —F, —Cl, —Br, —I, —CN, —R$_2$, —SR$_2$, —OH, —OR$_2$, —COOH, —COOR$_2$, —NH$_2$, —NHR$_2$, and —NR$_2$R$_3$, where R$_2$ and R$_3$ of $\pi_e$ are independently selected from a $C_1$-$C_{24}$ hydrocarbyl group, wherein substituted derivatives of $\pi_e$ comprise hydrocarbyl, aryl, heteroaryl, or hydrocarbylene substituents functionalized with one or multiple R groups selected from the group consisting of a substituted $C_1$-$C_{24}$ hydrocarbyl group, and any combination thereof.

4. The method of claim 1, wherein the copolymer that is prepared comprises the copolymer structure selected from the formulae (V)-(VI):

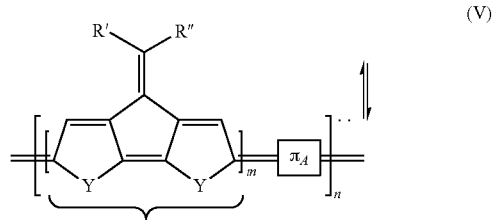

(V)

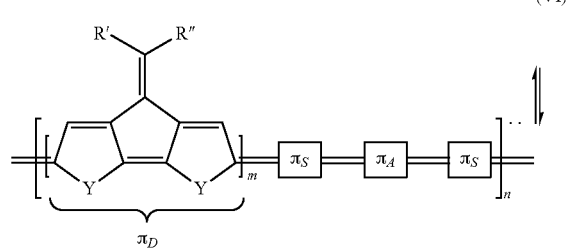

(VI)

wherein $\pi_D$ is the donor monomer and is selected from the group consisting of cyclopentadithiophene and cyclopentadiselenophene comprising a substituent R" and R', wherein R" and R' are each independently selected from the group consisting of unsubstituted $C_1$-$C_{36}$ hydrocarbyl, substituted $C_1$-$C_{36}$ hydrocarbyl, substituted $C_6$-$C_{20}$ aryl, substituted $C_3$-$C_{20}$ heteroaryl, unsubstituted $C_0$-$C_{36}$ hydrocarbylene $C_6$-$C_{20}$ aryl-$C_0$-$C_{36}$ hydrocarbyl, substituted $C_0$-$C_{36}$ hydrocarbylene $C_6$-$C_{20}$ aryl $C_0$-$C_{36}$ hydrocarbyl, —F, —Cl, -Br, —I, —CN, —R$_2$, —SR$_2$, —OR$_2$, —COOR$_2$, and —NR$_2$R$_3$, where R$_2$ and R$_3$ are independently selected from a $C_1$-$C_{24}$ hydrocarbyl group;

wherein ↓↑ represents a singlet state, $\pi_S$ is a conjugated spacer, $\pi_A$ is a moiety that is electron deficient, highly planar, pro-quinoidal, induces a transition from an aromatic electronic state to the quinoidal state, narrows the band gap, lowers $\Delta E_{ST}$, and enhances the multiple diradical character $y_i$ thus promoting open-shell character, and wherein $\pi_A$ is selected from the group consisting of substituted and unsubstituted moieties selected from the group consisting of thiadiazoloquinoxaline, quinoxaline, thienothiadiazole, thienopyridine, thienopyrazine, pyrazinoquinoxaline, benzothiadiazole, bis-benzothiadiazole, benzobisthiadiazole, thiazole, thiadiazolothienopyrazine, diketopyrrolopyrrole, and any combination thereof and tunability of $y_i$ can be achieved through the introduction of $\pi_S$;

Y of $\pi_D$ is selected from the group consisting of, S and Se; m of $\pi_D$ is either 1 or 2, n of the copolymer is an integer >1, and the resulting copolymer exhibits a singlet open-shell electronic ground state defined by an $S_0$ electronic state lying below $T_1$, and wherein the optional end-capped copolymer structure has the formula:

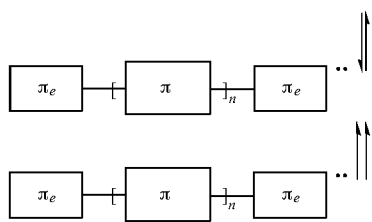

wherein -(π)-$_n$ is the copolymer,

⇈ represents a triplet state, ⇅ represents a singlet state, and $π_e$ is any substituted and unsubstituted moiety selected from the group consisting of thiophene, bithiophene, dithienothiophene, selenophene, biselenophene, diselenoselenophene, cyclopentadithiophene, cyclopentadiselenophene, and any combination thereof, as well as unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene, substituted $C_0$-$C_{36}$ hydrocarbylene, —F, —Cl, —Br, —I, —CN, —$R_2$, —$SR_2$, —OH, —$OR_2$, —COOH, —$COOR_2$, —$NH_2$, —$NHR_2$, and —$NR_2R_3$, where $R_2$ and $R_3$ of $π_e$ are independently selected from the group consisting of a $C_1$-$C_{24}$ hydrocarbyl group, and wherein substituted derivatives of $π_e$ comprise hydrocarbyl, aryl, heteroaryl, or hydrocarbylene substituents functionalized with one or multiple R groups selected from the group consisting of a substituted $C_1$-$C_{24}$ hydrocarbyl group, and any combination thereof.

5. The method of claim 1, wherein the copolymer that is prepared comprises the copolymer structure selected from the formulae (VII)-(VIII):

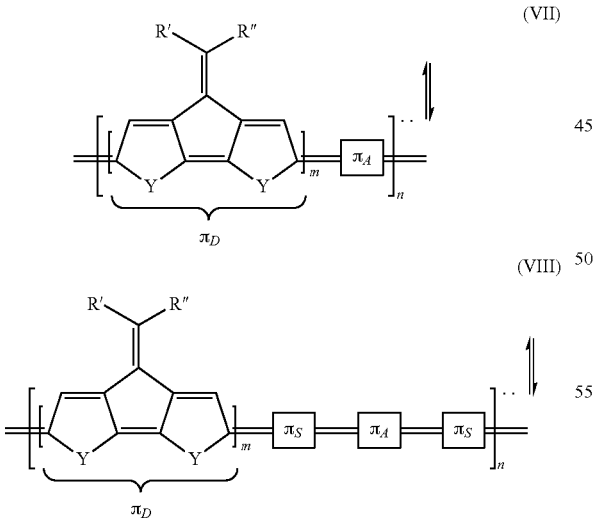

wherein $π_D$ is the donor monomer and is selected from the group consisting of cyclopentadithiophene and cyclopentadiselenophene comprising a substituent R" and R' wherein R" and R' are each independently selected from the group consisting of unsubstituted $C_1$-$C_{36}$ hydrocarbyl, substituted $C_1$-$C_{36}$ hydrocarbyl, substituted $C_6$-$C_{20}$ aryl, substituted $C_3$-$C_{20}$ heteroaryl, unsubstituted $C_0$-$C_{36}$ hydrocarbylene $C_6$-$C_{20}$ aryl-$C_0$-$C_{36}$ hydrocarbyl, substituted $C_0$-$C_{36}$ hydrocarbylene $C_6$-$C_{20}$ aryl $C_0$-$C_{36}$ hydrocarbyl, —F, —Cl, —Br, —I, —CN, —$R_2$, —$SR_2$, —$OR_2$, —$COOR_2$, and —$NR_2R_3$, where $R_2$ and $R_3$ are independently selected from a $C_1$-$C_{24}$ hydrocarbyl group;

wherein represents a triplet state, $π_S$ is a conjugated spacer, $π_A$ is a moiety that is electron deficient, highly planar, pro-quinoidal, induces a transition from an aromatic electronic state to the quinoidal state, narrows the band gap, lowers $ΔE_{ST}$, and enhances the multiple diradical character $y_i$ promoting open-shell character while stabilizing the triplet state relative to the singlet, and wherein $π_A$ is selected from the group consisting of substituted and unsubstituted moieties selected from the group consisting of thiadiazoloquinoxaline, quinoxaline, thienothiadiazole, thienopyridine, thienopyrazine, pyrazinoquinoxaline, benzothiadiazole, bisbenzothiadiazole, benzobisthiadiazole, thiazole, thiadiazolothienopyrazine, diketopyrrolopyrrole, and any combination thereof;

Y of $π_D$ is selected from the group consisting of, S and Se; m of $π_D$ is 1 or 2, n of the copolymer is an integer >1, and the resulting copolymer exhibits a triplet open-shell electronic ground state defined by a $T_0$ electronic state lying below $S_1$, and wherein the optional end-capped copolymer structure has the formula:

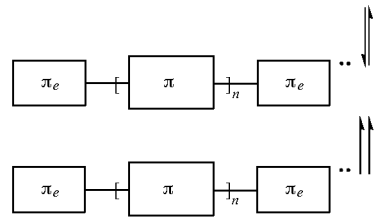

wherein -(π)-$_n$ is the copolymer,

⇈ represents a triplet state, ⇅ represents a singlet state, and $π_e$ is any substituted and unsubstituted moiety selected from the group consisting of thiophene, bithiophene, dithienothiophene, selenophene, biselenophene, diselenoselenophene, cyclopentadithiophene, cyclopentadiselenophene, and any combination thereof, as well as unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene, substituted $C_0$-$C_{36}$ hydrocarbylene, —F, —Cl, —Br, —I, —CN, —$R_2$, —$SR_2$, —OH, —$OR_2$, —COOH, —$COOR_2$, —$NH_2$, —$NHR_2$, and —$NR_2R_3$, where $R_2$ and $R_3$ of $π_e$ are independently selected from a $C_1$-$C_{24}$ hydrocarbyl group, and wherein substituted derivatives of $π_e$ comprise hydrocarbyl, aryl, heteroaryl, or hydrocarbylene substituents functionalized with one or multiple R groups selected from the group consisting of a substituted $C_1$-$C_{24}$ hydrocarbyl group, and any combination thereof.

6. The method of claim 1, wherein the copolymer that is prepared comprises a copolymer structure exhibiting open-shell character consisting of alternating donor-acceptor monomers and has the formulae:

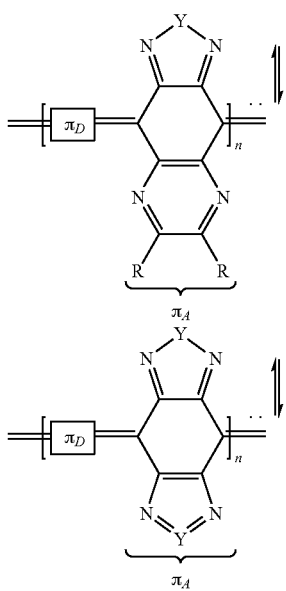

wherein ↑↑ represents a singlet state,

R of $\pi_A$ is selected from the group consisting of unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene $C_6$-$C_{20}$ aryl-$C_0$-$C_{36}$ hydrocarbyl, substituted $C_0$-$C_{36}$ hydrocarbylene $C_6$-$C_{20}$ aryl $C_0$-$C_{36}$ hydrocarbyl, —F, —Cl, —Br, —I, —CN, —$R_2$, —$SR_2$, —OH, —$OR_2$, —COOH, —$COOR_2$, —$NH_2$, —$NHR_2$, and —$NR_2R_3$, where $R_2$ and $R_3$ are independently selected from a $C_1$-$C_{24}$ hydrocarbyl group;

Y of $\pi_A$ is selected from the group consisting of, S, Se, Te, $BR_3$, $PR_3$, NH, NR, $NR_2$ and Si, wherein R, $R_2$, and $R_3$ of $\pi_A$ are each independently selected from the group consisting of unsubstituted $C_1$-$C_{36}$ hydrocarbyl, substituted $C_1$-$C_{36}$ hydrocarbyl, and any combination thereof;

n of the copolymer is an integer >1, and the resulting copolymer exhibits a singlet open-shell electronic ground state defined by an $S_0$ electronic state lying below $T_1$; and $\pi_D$ is the donor monomer that is electron rich, highly planar, pro-quinoidal, induces a transition from an aromatic electronic state to the quinoidal state, narrows the band gap, lowers $\Delta E_{ST}$, and enhances the multiple diradical character y promoting open-shell character and $\pi_D$ is selected from the group consisting of substituted and unsubstituted moieties from the group consisting of cyclopentadithiophene and cyclopentadiselenophene, and wherein the optional end-capped copolymer structure has the formula:

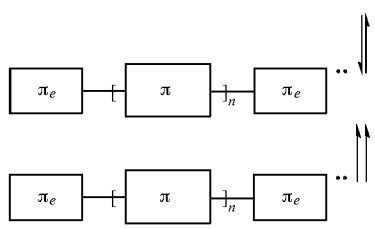

wherein $\pi_n$ is the copolymer compound,

↑↑ represents a triplet state, ↓↑ represents a singlet state, and $\pi_e$ is any substituted and unsubstituted moiety selected from the group consisting of thiophene, bithiophene, dithienothiophene, selenophene, biselenophene, diselenoselenophene, cyclopentadithiophene, cyclopentadiselenophene, and any combination thereof, as well as unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene, substituted $C_0$-$C_{36}$ hydrocarbylene, —F, —Cl, —Br, —I, —CN, —$R_2$, —$SR_2$, —OH, —$OR_2$, —COOH, —$COOR_2$, —$NH_2$, —$NHR_2$, and —$NR_2R_3$, where $R_2$ and $R_3$ of $\pi_e$ are independently selected from a $C_1$-$C_{24}$ hydrocarbyl group, and wherein substituted derivatives of $\pi_e$ comprise hydrocarbyl, aryl, heteroaryl, or hydrocarbylene substituents functionalized with one (or multiple) R groups selected from the group consisting of a substituted $C_1$-$C_{24}$ hydrocarbyl group, and any combination thereof.

7. The method of claim 1, wherein the copolymer that is prepared comprises a copolymer structure exhibiting open-shell character consisting of alternating donor-acceptor monomers and has the formulae:

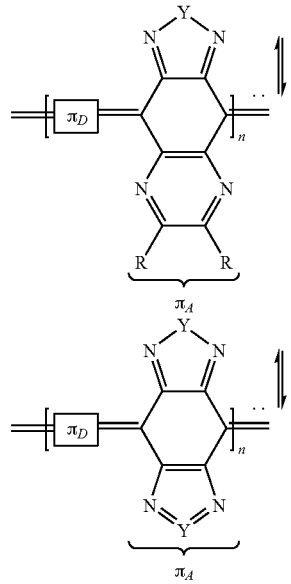

wherein ↑↑ represents a triplet state;

R of $\pi_A$ is selected from the group consisting of unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene $C_6$-$C_{20}$ aryl-$C_0$-$C_{36}$ hydrocarbyl, substituted $C_0$-$C_{36}$ hydrocarbylene $C_6$-$C_{20}$ aryl $C_0$-$C_{36}$ hydrocarbyl, —F, —Cl, —Br, —I, —CN, —$R_2$, —$SR_2$, —OH, —$OR_2$, —COOH, —$COOR_2$, —$NH_2$, —$NHR_2$, and —$NR_2R_3$, where $R_2$ and $R_3$ are independently selected from a $C_1$-$C_{24}$ hydrocarbyl group;

Y of $\pi_A$ is selected from the group consisting of, S, Se, Te, $BR_3$, $PR_3$, NH, NR, $NR_2$ and Si, wherein R, $R_2$, and $R_3$ of Y of $\pi_A$ are each independently selected from the group consisting of unsubstituted $C_1$-$C_{36}$ hydrocarbyl, substituted $C_1$-$C_{36}$ hydrocarbyl, and any combination thereof;

n of the copolymer is an integer >1, and the resulting copolymer exhibits a triplet open-shell electronic ground state defined by a $T_0$ electronic state lying below Si; and $\pi_D$ is the donor monomer that is highly planar, pro-quinoidal, induces a transition from an aromatic electronic state to the quinoidal state, narrows the band gap, lowers $\Delta E_{ST}$, and enhances the multiple diradical character y, promoting open-shell character and $\pi_D$ is selected from the group consisting of substituted and unsubstituted moieties from the group consisting of cyclopentadithiophene and cyclopentadiselenophene, and the optional end-capped copolymer structure has the formula:

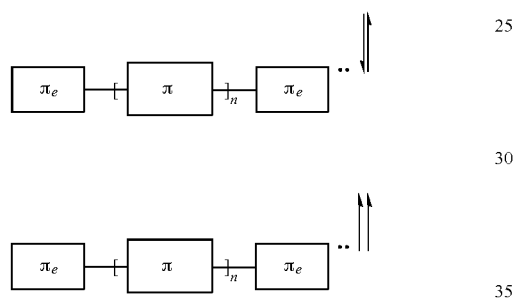

wherein -(π)-$_n$ is the copolymer and;

↑↑ represents a triplet state, ↓↑ represents a singlet state, and $\pi_e$ is any substituted and unsubstituted moiety selected from the group consisting of thiophene, bithiophene, dithienothiophene, selenophene, biselenophene, diselenoselenophene, cyclopentadithiophene, cyclopentadiselenophene, and any combination thereof, as well as unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene, substituted $C_0$-$C_{36}$ hydrocarbylene, —F, —Cl, —Br, —I, —CN, —$R_2$, —$SR_2$, —OH, —$OR_2$, —COOH, —$COOR_2$, —$NH_2$, —$NHR_2$, and —$NR_2R_3$, where $R_2$ and $R_3$ of $\pi_e$ are independently selected from a $C_1$-$C_{24}$ hydrocarbyl group, and substituted derivatives of $\pi_e$ comprise hydrocarbyl, aryl, heteroaryl, or hydrocarbylene substituents functionalized with one or multiple R groups selected from the group consisting of a substituted $C_1$-$C_{24}$ hydrocarbyl group, and any combination thereof.

8. The method of claim 1, wherein the copolymer that is prepared comprises a copolymer structure exhibiting open-shell character consisting of alternating donor-acceptor monomers and has the formulae:

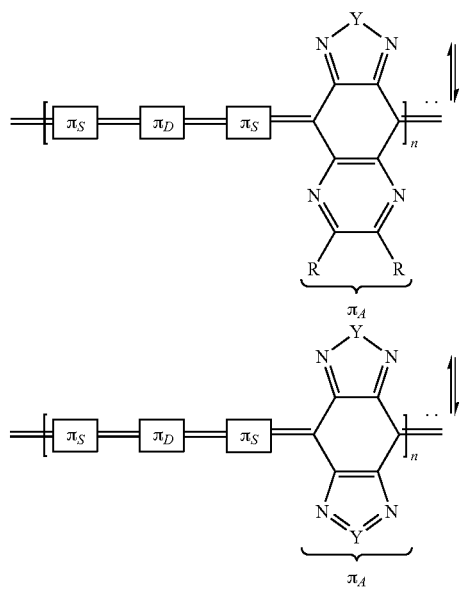

wherein ↓↑ represents a singlet state,

R of $\pi_A$ is selected from the group consisting of unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene $C_6$-$C_{20}$ aryl-$C_0$-$C_{36}$ hydrocarbyl, substituted $C_0$-$C_{36}$ hydrocarbylene $C_6$-$C_{20}$ aryl $C_0$-$C_{36}$ hydrocarbyl, —F, —Cl, —Br, —I, —CN, —$R_2$, —$SR_2$, —OH, —$OR_2$, —COOH, —$COOR_2$, —$NH_2$, —$NHR_2$, and —$NR_2R_3$, where $R_2$ and $R_3$ are independently selected from a $C_1$-$C_{24}$ hydrocarbyl group;

$\pi_D$ is the donor monomer, that is electron rich, highly planar, pro-quinoidal, induces a transition from an aromatic electronic state to the quinoidal state, narrows the band gap, lowers $\Delta E_{ST}$, and enhances the multiple diradical character y promoting open-shell character; and $\pi_D$ is selected from the group consisting of substituted and unsubstituted moieties from the group consisting of cyclopentadithiophene and cyclopentadiselenophene;

Y of $\pi_A$ is selected from the group consisting of, S, Se, Te, Si, $BR_3$, $PR_3$, NH, NR, $NR_2$ and Si, wherein R, $R_2$, and $R_3$ of Y of $\pi_A$ is selected from the group consisting of unsubstituted $C_1$-$C_{36}$ hydrocarbyl, substituted $C_1$-$C_{36}$ hydrocarbyl, and any combination thereof;

n of the copolymer is an integer >1, and the resulting copolymer exhibits a singlet open-shell electronic ground state defined by the $S_0$ electronic state lying below $T_1$, and the optional end-capped polymer structure has the formula:

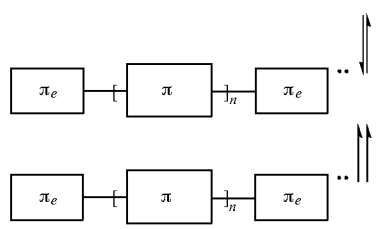

wherein ↑↑ represents a triplet state, ↓↑ represents a singlet state,
-(π)-$_n$ is the copolymer compound, and
π$_e$ is any substituted and unsubstituted moieties selected from the group consisting of thiophene, bithiophene, dithienothiophene, selenophene, biselenophene, diselenoselenophene, cyclopentadithiophene, cyclopentadiselenophene, or a combination thereof, and unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene, substituted $C_0$-$C_{36}$ hydrocarbylene, —F, —Cl, —Br, —I, —CN, —$R_2$, —$SR_2$, —OH, —$OR_2$, —COOH, —$COOR_2$, —$NH_2$, —$NHR_2$, and $NR_2R_3$, where $R_2$ and $R_3$ of this group are independently selected from a $C_1$-$C_{24}$ hydrocarbyl group, and wherein substituted derivatives comprise hydrocarbyl, aryl, heteroaryl, or hydrocarbylene substituents functionalized with one or multiple R groups.

9. The method of claim 1, wherein the copolymer to be prepared comprises a copolymer structure exhibiting open-shell character consisting of alternating donor-acceptor monomers and has the formulae:

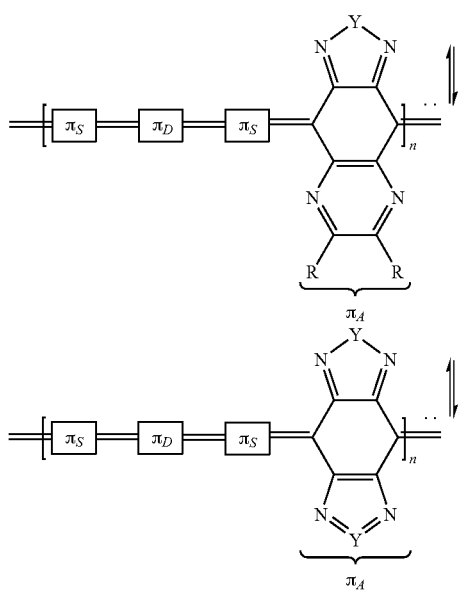

wherein ↑↑ represents a triplet state;
R of π$_A$ is selected from the group consisting of unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene, substituted $C_0$-$C_{36}$ hydrocarbylene, —F, —Cl, —Br, —I, —CN, —$R_2$, —$SR_2$, —OH, —$OR_2$, —COOH, —$COOR_2$, —$NH_2$, —$NHR_2$, and —$NR_2R_3$, where $R_2$ and $R_3$ are independently selected from a $C_1$-$C_{24}$ hydrocarbyl group, wherein substituted derivatives of π$_A$ comprise hydrocarbyl, aryl, heteroaryl, or hydrocarbylene substituents functionalized with one or multiple R groups selected from a substituted $C_1$-$C_{24}$ hydrocarbyl group, and any combination thereof;

π$_D$ is the donor monomer that is electron rich, highly planar, pro-quinoidal, induces a transition from an aromatic electronic state to the quinoidal state, narrows the band gap, lowers $\Delta E_{ST}$, and enhances the multiple diradical character y$_i$ promoting open-shell character; wherein π$_D$ is selected from the group consisting of substituted and unsubstituted moieties from the group consisting of cyclopentadithiophene and cyclopentadiselenophene;

Y of π$_A$ is selected from the group consisting of, S, Se, Te, $BR_3$, $PR_3$, NH, NR, $NR_2$, and Si, wherein R, $R_2$, and $R_3$ of Y of π$_A$ are each independently selected from the group consisting of unsubstituted $C_1$-$C_{36}$ hydrocarbyl, substituted $C_1$-$C_{36}$ hydrocarbyl, and any combination thereof;

n of the copolymer is an integer >1, and the resulting copolymer exhibits a triplet open-shell electronic ground state defined by a $T_0$ electronic state lying below $S_1$, and the optional end-capped copolymer structure has the formula:

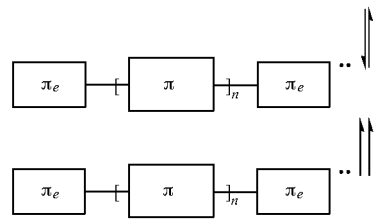

wherein ↑↑ represents a triplet state, ↓↑ represents a singlet state,
-(π)-$_n$ is the copolymer compound, and
π$_e$ is any substituted and unsubstituted moiety selected from the group consisting of thiophene, bithiophene, dithienothiophene, selenophene, biselenophene, diselenoselenophene, cyclopentadithiophene, cyclopentadiselenophene, and any combination thereof, as well as unsubstituted $C_1$-$C_{36}$ hydrocarbyl, substituted $C_1$-$C_{36}$ hydrocarbyl, unsubstituted $C_6$-$C_{20}$ aryl, substituted $C_6$-$C_{20}$ aryl, unsubstituted $C_3$-$C_{20}$ heteroaryl, substituted $C_3$-$C_{20}$ heteroaryl, unsubstituted $C_0$-$C_{36}$ hydrocarbylene, substituted $C_0$-$C_{36}$ hydrocarbylene, —F, —Cl, —Br, —I, —CN, —$R_2$, —$SR_2$, —OH, —$OR_2$, —COOH, —$COOR_2$, —$NH_2$, —$NHR_2$, and $NR_2R_3$, where $R_2$ and $R_3$ of π$_e$ are independently selected from a $C_1$-$C_{24}$ hydrocarbyl group, and wherein substituted derivatives of π$_e$ comprise hydrocarbyl, aryl, heteroaryl, or hydrocarbylene substituents functionalized with one or multiple R groups selected from the group consisting of a substituted $C_1$-$C_{24}$ hydrocarbyl group, and any combination thereof.

10. The method of claim 1, wherein the copolymer has a form selected from the group consisting of suspension, solution, gel, and films.

11. The method of claim 1, further comprising preparing the copolymer by mixing or blending a filler, dopant, and/or additive with monomers during the polymerization or with the copolymers after polymerization.

12. The method of claim 1, wherein the copolymer is dissolved in organic solvent, aqueous solvent, or a combination thereof.

13. The method of claim 1, wherein the copolymer is spin coated on a substrate to form a thin conductive product film.

14. The method of claim 1, wherein the copolymer is slow evaporated on a substrate to provide a uniform conductive product film.

15. The method of claim 14, wherein the copolymer provides a free-standing film that can be delaminated from the substrate.

16. The method of claim 1, wherein a uniform conductive product film is formed from the copolymer on a substrate by spin coating, spray coating, brush coating, doctor blade coating, electrospinning, dip coating, meniscus, curtain casting, drop casting, ink jet printing, screen printing, reel to reel printing, roll to roll printing, directional solidification, aligning polymers on rubbed or grooved substrates, or a combination thereof; the substrate is glass, quartz, metal, plastic, silicon, silica, mineral, ceramic, semiconducting material, or a combination thereof; and wherein film post-treatment is thermal annealing at different temperatures, solvent annealing with different solvents or solvent mixtures, mechanical rubbing, template wetting, stretching, or a combination thereof.

17. The method of claim 1, wherein the copolymer is formed by friction transfer, melting process, compression modeling, extrusion, and/or injecting modeling.

18. The method of claim 1, further comprising dispersing single walled carbon nanotubes (SWCNTs) in a solvent with the conjugated copolymer.

19. The method of claim 1, wherein the copolymer is modulated by blending with fillers or additives selected from the group consisting of metal particles, carbon-based material, non-conductive material, conducting material, semiconducting material, and a combination thereof.

20. The method of claim 1, wherein the conductivity of the copolymer is elevated by blending with dopants selected from the group consisting of conventional acidic dopants, p-dopants, mineral acids, organic sulfonic acids, polymeric sulfonic acids, polycarboxylic acids; carboxylic acids, dopants based on suitable base such as K and/or Li; open-shell small radical dopants, galvinoxyl radical, TEMPO radical; F4-TCNQ, $I_2$, and a combination thereof.

21. The method of claim 1, wherein the copolymer provides retained conductivity after at least one year of environmental exposure.

* * * * *